(12) United States Patent
Mishra et al.

(10) Patent No.: US 8,901,604 B2
(45) Date of Patent: Dec. 2, 2014

(54) SEMICONDUCTOR DEVICES WITH GUARD RINGS

(75) Inventors: Umesh Mishra, Montecito, CA (US); Srabanti Chowdhury, Goleta, CA (US); Yuvaraj Dora, Goleta, CA (US)

(73) Assignee: Transphorm Inc., Goleta, CA (US)

( * ) Notice: Subject to any disclaimer, the term of this patent is extended or adjusted under 35 U.S.C. 154(b) by 528 days.

(21) Appl. No.: 13/226,380

(22) Filed: Sep. 6, 2011

(65) Prior Publication Data

US 2013/0056744 A1     Mar. 7, 2013

(51) Int. Cl.
| | |
|---|---|
| *H01L 29/02* | (2006.01) |
| *H01L 29/66* | (2006.01) |
| *H01L 29/40* | (2006.01) |
| *H01L 29/778* | (2006.01) |
| *H01L 29/06* | (2006.01) |
| *H01L 29/872* | (2006.01) |
| *H01L 29/20* | (2006.01) |
| *H01L 29/423* | (2006.01) |
| *H01L 29/417* | (2006.01) |

(52) U.S. Cl.
CPC ...... *H01L 29/0619* (2013.01); *H01L 29/66212* (2013.01); *H01L 29/404* (2013.01); *H01L 29/7786* (2013.01); *H01L 29/402* (2013.01); *H01L 29/2003* (2013.01); *H01L 29/872* (2013.01); *H01L 29/66462* (2013.01); *H01L 29/42376* (2013.01); *H01L 29/41766* (2013.01)
USPC .......... 257/170; 257/76; 257/E29.12

(58) Field of Classification Search
CPC . H01L 29/7811; H01L 29/402; H01L 29/404; H01L 29/0638; H01L 29/66348; H01L 29/66462; H01L 29/6642; H01I 29/0619; H01I 29/402

USPC .............. 257/76, 194, E29.013, E29.246, 257/E21.407, 170, 409, 452, 484, 490, 494, 257/495, 605, E29.012, 6; 438/140, 454
See application file for complete search history.

(56) References Cited

U.S. PATENT DOCUMENTS

| | | |
|---|---|---|
| 4,300,091 A | 11/1981 | Schade, Jr. |
| 4,645,562 A | 2/1987 | Liao et al. |

(Continued)

FOREIGN PATENT DOCUMENTS

| | | |
|---|---|---|
| CN | 1748320 A | 3/2006 |
| CN | 101107713 | 1/2008 |

(Continued)

OTHER PUBLICATIONS

International Application No. PCT/US2009/066647, International Preliminary Report on Patentability, 12 pages, Jun. 14, 2011.

(Continued)

*Primary Examiner* — Cuong Q Nguyen
*Assistant Examiner* — Yosef Gebreyesus
(74) *Attorney, Agent, or Firm* — Fish & Richardson P.C.

(57) ABSTRACT

Semiconductor devices with guard rings are described. The semiconductor devices may be, e.g., transistors and diodes designed for high-voltage applications. A guard ring is a floating electrode formed of electrically conducting material above a semiconductor material layer. A portion of an insulating layer is between at least a portion of the guard ring and the semiconductor material layer. A guard ring may be located, for example, on a transistor between a gate and a drain electrode. A semiconductor device may have one or more guard rings.

41 Claims, 12 Drawing Sheets

(56) References Cited

U.S. PATENT DOCUMENTS

| | | |
|---|---|---|
| 4,728,826 A | 3/1988 | Einsinger et al. |
| 4,821,093 A | 4/1989 | Lafrate et al. |
| 4,914,489 A | 4/1990 | Awano |
| 5,051,618 A | 9/1991 | Lou |
| 5,329,147 A | 7/1994 | Vo et al. |
| 5,618,384 A | 4/1997 | Chan et al. |
| 5,646,069 A | 7/1997 | Jelloian et al. |
| 5,663,091 A | 9/1997 | Yen et al. |
| 5,705,847 A | 1/1998 | Kashiwa et al. |
| 5,714,393 A | 2/1998 | Wild et al. |
| 5,909,103 A | 6/1999 | Williams |
| 5,998,810 A | 12/1999 | Hatano et al. |
| 6,008,684 A | 12/1999 | Ker et al. |
| 6,097,046 A | 8/2000 | Plumton |
| 6,100,571 A | 8/2000 | Mizuta et al. |
| 6,292,500 B1 | 9/2001 | Kouchi et al. |
| 6,316,793 B1 | 11/2001 | Sheppard et al. |
| 6,373,082 B1 | 4/2002 | Ohno et al. |
| 6,475,889 B1 | 11/2002 | Ring |
| 6,486,502 B1 | 11/2002 | Sheppard et al. |
| 6,504,235 B2 | 1/2003 | Schmitz et al. |
| 6,515,303 B2 | 2/2003 | Ring |
| 6,548,333 B2 | 4/2003 | Smith |
| 6,583,454 B2 | 6/2003 | Sheppard et al. |
| 6,586,781 B2 | 7/2003 | Wu et al. |
| 6,649,497 B2 | 11/2003 | Ring |
| 6,727,531 B1 | 4/2004 | Redwing et al. |
| 6,777,278 B2 | 8/2004 | Smith |
| 6,849,882 B2 | 2/2005 | Chavarkar et al. |
| 6,867,078 B1 | 3/2005 | Green et al. |
| 6,946,739 B2 | 9/2005 | Ring |
| 6,979,863 B2 | 12/2005 | Ryu |
| 6,982,204 B2 | 1/2006 | Saxler et al. |
| 7,030,428 B2 | 4/2006 | Saxler |
| 7,045,404 B2 | 5/2006 | Sheppard et al. |
| 7,071,498 B2 | 7/2006 | Johnson et al. |
| 7,084,475 B2 | 8/2006 | Shelton et al. |
| 7,125,786 B2 | 10/2006 | Ring et al. |
| 7,161,194 B2 | 1/2007 | Parikh et al. |
| 7,170,111 B2 | 1/2007 | Saxler |
| 7,230,284 B2 | 6/2007 | Parikh et al. |
| 7,238,560 B2 | 7/2007 | Sheppard et al. |
| 7,253,454 B2 | 8/2007 | Saxler |
| 7,265,399 B2 | 9/2007 | Sriram et al. |
| 7,268,375 B2 | 9/2007 | Shur et al. |
| 7,304,331 B2 | 12/2007 | Saito et al. |
| 7,321,132 B2 | 1/2008 | Robinson et al. |
| 7,326,971 B2 | 2/2008 | Harris et al. |
| 7,332,795 B2 | 2/2008 | Smith et al. |
| 7,364,988 B2 | 4/2008 | Harris et al. |
| 7,388,236 B2 | 6/2008 | Wu et al. |
| 7,419,892 B2 | 9/2008 | Sheppard et al. |
| 7,432,142 B2 | 10/2008 | Saxler et al. |
| 7,456,443 B2 | 11/2008 | Saxler et al. |
| 7,465,967 B2 | 12/2008 | Smith et al. |
| 7,501,669 B2 | 3/2009 | Parikh et al. |
| 7,544,963 B2 | 6/2009 | Saxler |
| 7,547,925 B2 | 6/2009 | Wong et al. |
| 7,548,112 B2 | 6/2009 | Sheppard |
| 7,550,783 B2 | 6/2009 | Wu et al. |
| 7,550,784 B2 | 6/2009 | Saxler et al. |
| 7,566,580 B2 | 7/2009 | Keller et al. |
| 7,566,918 B2 | 7/2009 | Wu et al. |
| 7,573,078 B2 | 8/2009 | Wu et al. |
| 7,592,211 B2 | 9/2009 | Sheppard et al. |
| 7,595,262 B2 | 9/2009 | Schlosser |
| 7,598,108 B2 | 10/2009 | Li et al. |
| 7,612,390 B2 | 11/2009 | Saxler et al. |
| 7,615,774 B2 | 11/2009 | Saxler |
| 7,638,818 B2 | 12/2009 | Wu et al. |
| 7,678,628 B2 | 3/2010 | Sheppard et al. |
| 7,692,263 B2 | 4/2010 | Wu et al. |
| 7,709,269 B2 | 5/2010 | Smith et al. |
| 7,709,859 B2 | 5/2010 | Smith et al. |
| 7,745,851 B2 | 6/2010 | Harris |
| 7,755,108 B2 | 7/2010 | Kuraguchi |
| 7,759,700 B2 | 7/2010 | Ueno et al. |
| 7,777,252 B2 | 8/2010 | Sugimoto et al. |
| 7,777,254 B2 | 8/2010 | Saito |
| 7,795,642 B2 | 9/2010 | Suh et al. |
| 7,812,369 B2 | 10/2010 | Chini et al. |
| 7,855,401 B2 | 12/2010 | Sheppard et al. |
| 7,875,537 B2 | 1/2011 | Suvorov et al. |
| 7,884,395 B2 | 2/2011 | Saito |
| 7,892,974 B2 | 2/2011 | Ring et al. |
| 7,893,500 B2 | 2/2011 | Wu et al. |
| 7,898,004 B2 | 3/2011 | Wu et al. |
| 7,901,994 B2 | 3/2011 | Saxler et al. |
| 7,906,799 B2 | 3/2011 | Sheppard et al. |
| 7,915,643 B2 | 3/2011 | Suh et al. |
| 7,915,644 B2 | 3/2011 | Wu et al. |
| 7,919,791 B2 | 4/2011 | Flynn et al. |
| 7,919,824 B2 * | 4/2011 | Ono et al. ..................... 257/401 |
| 7,928,475 B2 | 4/2011 | Parikh et al. |
| 7,935,985 B2 | 5/2011 | Mishra et al. |
| 7,939,391 B2 | 5/2011 | Suh et al. |
| 7,948,011 B2 | 5/2011 | Rajan et al. |
| 7,955,918 B2 | 6/2011 | Wu et al. |
| 7,955,984 B2 | 6/2011 | Ohki |
| 7,960,756 B2 | 6/2011 | Sheppard et al. |
| 7,965,126 B2 | 6/2011 | Honea et al. |
| 7,985,986 B2 | 7/2011 | Heikman et al. |
| 8,039,352 B2 | 10/2011 | Mishra et al. |
| 8,049,252 B2 | 11/2011 | Smith et al. |
| 8,114,717 B2 | 2/2012 | Palacios et al. |
| 8,519,438 B2 | 8/2013 | Mishra et al. |
| 2001/0032999 A1 | 10/2001 | Yoshida |
| 2001/0040247 A1 | 11/2001 | Ando |
| 2002/0036287 A1 | 3/2002 | Yu et al. |
| 2002/0121648 A1 | 9/2002 | Hsu et al. |
| 2002/0167023 A1 | 11/2002 | Chavarkar et al. |
| 2003/0003724 A1 | 1/2003 | Uchiyama et al. |
| 2003/0006437 A1 | 1/2003 | Mizuta et al. |
| 2003/0020092 A1 | 1/2003 | Parikh et al. |
| 2004/0041169 A1 | 3/2004 | Ren et al. |
| 2004/0061129 A1 | 4/2004 | Saxler et al. |
| 2004/0164347 A1 | 8/2004 | Zhao et al. |
| 2005/0077541 A1 | 4/2005 | Shen |
| 2005/0133816 A1 | 6/2005 | Fan |
| 2005/0189561 A1 | 9/2005 | Kinzer et al. |
| 2005/0189562 A1 | 9/2005 | Kinzer et al. |
| 2005/0194612 A1 | 9/2005 | Beach |
| 2005/0253168 A1 | 11/2005 | Wu et al. |
| 2005/0274977 A1 | 12/2005 | Saito et al. |
| 2006/0011915 A1 | 1/2006 | Saito et al. |
| 2006/0043499 A1 | 3/2006 | De Cremoux et al. |
| 2006/0060871 A1 | 3/2006 | Beach |
| 2006/0076677 A1 | 4/2006 | Daubenspeck et al. |
| 2006/0102929 A1 | 5/2006 | Okamoto et al. |
| 2006/0108602 A1 | 5/2006 | Tanimoto |
| 2006/0108605 A1 | 5/2006 | Yanagihara et al. |
| 2006/0121682 A1 | 6/2006 | Saxler |
| 2006/0124962 A1 | 6/2006 | Ueda et al. |
| 2006/0145189 A1 * | 7/2006 | Beach ........................... 257/192 |
| 2006/0157729 A1 | 7/2006 | Ueno et al. |
| 2006/0186422 A1 | 8/2006 | Gaska et al. |
| 2006/0189109 A1 | 8/2006 | Fitzgerald |
| 2006/0202272 A1 | 9/2006 | Wu et al. |
| 2006/0220063 A1 | 10/2006 | Kurachi |
| 2006/0226442 A1 | 10/2006 | Zhang et al. |
| 2006/0255364 A1 | 11/2006 | Saxler |
| 2006/0289901 A1 | 12/2006 | Sheppard et al. |
| 2007/0007547 A1 | 1/2007 | Beach |
| 2007/0018187 A1 | 1/2007 | Lee et al. |
| 2007/0018199 A1 | 1/2007 | Sheppard et al. |
| 2007/0018210 A1 | 1/2007 | Sheppard |
| 2007/0045670 A1 | 3/2007 | Kuraguchi |
| 2007/0080672 A1 | 4/2007 | Yang |
| 2007/0128743 A1 | 6/2007 | Huang et al. |
| 2007/0132037 A1 | 6/2007 | Hoshi et al. |
| 2007/0134834 A1 | 6/2007 | Lee et al. |
| 2007/0145390 A1 | 6/2007 | Kuraguchi |
| 2007/0158692 A1 | 7/2007 | Nakayama et al. |
| 2007/0164315 A1 | 7/2007 | Smith et al. |

(56) References Cited

U.S. PATENT DOCUMENTS

| | | |
|---|---|---|
| 2007/0164322 A1 | 7/2007 | Smith et al. |
| 2007/0194354 A1 | 8/2007 | Wu et al. |
| 2007/0205433 A1 | 9/2007 | Parikh et al. |
| 2007/0210329 A1 | 9/2007 | Goto |
| 2007/0215899 A1 | 9/2007 | Herman |
| 2007/0224710 A1 | 9/2007 | Palacios et al. |
| 2007/0228477 A1 | 10/2007 | Suzuki et al. |
| 2007/0241368 A1 | 10/2007 | Mil'shtein et al. |
| 2007/0278518 A1 | 12/2007 | Chen et al. |
| 2007/0295985 A1 | 12/2007 | Weeks, Jr. et al. |
| 2008/0054247 A1 | 3/2008 | Eichler et al. |
| 2008/0073670 A1 | 3/2008 | Yang et al. |
| 2008/0093621 A1 | 4/2008 | Takeda et al. |
| 2008/0093626 A1 | 4/2008 | Kuraguchi |
| 2008/0111144 A1 | 5/2008 | Fichtenbaum et al. |
| 2008/0121876 A1 | 5/2008 | Otsuka et al. |
| 2008/0157121 A1 | 7/2008 | Ohki |
| 2008/0203430 A1 | 8/2008 | Simin et al. |
| 2008/0230784 A1 | 9/2008 | Murphy |
| 2008/0237606 A1 | 10/2008 | Kikkawa et al. |
| 2008/0237640 A1 | 10/2008 | Mishra et al. |
| 2008/0274574 A1 | 11/2008 | Yun |
| 2008/0283844 A1 | 11/2008 | Hoshi et al. |
| 2008/0296618 A1 | 12/2008 | Suh et al. |
| 2008/0308813 A1 | 12/2008 | Suh et al. |
| 2009/0001409 A1 | 1/2009 | Takano et al. |
| 2009/0032820 A1 | 2/2009 | Chen |
| 2009/0032879 A1 | 2/2009 | Kuraguchi |
| 2009/0045438 A1 | 2/2009 | Inoue et al. |
| 2009/0050936 A1 | 2/2009 | Oka |
| 2009/0065810 A1 | 3/2009 | Honea et al. |
| 2009/0072240 A1 | 3/2009 | Suh et al. |
| 2009/0072269 A1 | 3/2009 | Suh et al. |
| 2009/0072272 A1 | 3/2009 | Suh et al. |
| 2009/0075455 A1 | 3/2009 | Mishra et al. |
| 2009/0085065 A1 | 4/2009 | Mishra et al. |
| 2009/0140262 A1 | 6/2009 | Ohki et al. |
| 2009/0146185 A1 | 6/2009 | Suh et al. |
| 2009/0201072 A1 | 8/2009 | Honea et al. |
| 2009/0218598 A1 | 9/2009 | Goto |
| 2009/0267078 A1 | 10/2009 | Mishra et al. |
| 2009/0278144 A1 | 11/2009 | Sonobe et al. |
| 2010/0019225 A1 | 1/2010 | Lee |
| 2010/0019279 A1 | 1/2010 | Chen et al. |
| 2010/0025730 A1* | 2/2010 | Heikman et al. ............... 257/194 |
| 2010/0065923 A1 | 3/2010 | Charles et al. |
| 2010/0067275 A1 | 3/2010 | Wang et al. |
| 2010/0133506 A1 | 6/2010 | Nakanishi et al. |
| 2010/0140660 A1 | 6/2010 | Wu et al. |
| 2010/0201439 A1 | 8/2010 | Wu et al. |
| 2010/0203234 A1 | 8/2010 | Anderson et al. |
| 2010/0219445 A1 | 9/2010 | Yokoyama et al. |
| 2010/0244087 A1 | 9/2010 | Horie et al. |
| 2010/0264461 A1 | 10/2010 | Rajan et al. |
| 2010/0288998 A1 | 11/2010 | Kikuchi et al. |
| 2010/0314666 A1* | 12/2010 | Saito et al. ..................... 257/201 |
| 2011/0006346 A1 | 1/2011 | Ando et al. |
| 2011/0012110 A1 | 1/2011 | Sazawa et al. |
| 2011/0220917 A1* | 9/2011 | Hayashi et al. ................. 257/77 |
| 2011/0249359 A1 | 10/2011 | Mochizuki et al. |
| 2012/0168822 A1 | 7/2012 | Matsushita |
| 2012/0193638 A1 | 8/2012 | Keller et al. |
| 2012/0211800 A1 | 8/2012 | Boutros |
| 2012/0217512 A1 | 8/2012 | Renaud |
| 2012/0267637 A1* | 10/2012 | Jeon et al. ........................ 257/76 |
| 2012/0315445 A1 | 12/2012 | Mizuhara et al. |

FOREIGN PATENT DOCUMENTS

| | | |
|---|---|---|
| CN | 10132207 | 11/2008 |
| CN | 101897029 A | 11/2010 |
| CN | 102017160 A | 4/2011 |
| CN | 103477543 | 12/2013 |
| CN | 103493206 | 1/2014 |
| EP | 1998376 A1 | 12/2008 |
| JP | 11-224950 | 8/1999 |
| JP | 2004-260114 A | 9/2004 |
| JP | 2006-32749 A | 2/2006 |
| JP | 2010-087076 | 4/2010 |
| TW | 200947703 | 11/2009 |
| TW | 201010076 | 3/2010 |
| TW | 201027759 | 7/2010 |
| WO | WO 2004/070791 | 8/2004 |
| WO | WO 2004/098060 | 11/2004 |
| WO | WO 2005/070007 | 8/2005 |
| WO | WO 2005/070009 | 8/2005 |
| WO | WO 2006/114883 | 11/2006 |
| WO | WO 2007/077666 | 7/2007 |
| WO | WO 2007/108404 | 9/2007 |
| WO | WO 2008/120094 | 10/2008 |
| WO | WO 2009/076076 | 6/2009 |
| WO | WO 2009/132039 | 10/2009 |
| WO | WO 2010/068554 | 6/2010 |
| WO | WO 2010/132587 | 11/2010 |
| WO | WO 2011/031431 | 3/2011 |
| WO | WO 2011/072027 | 6/2011 |
| WO | WO 2013/052833 | 4/2013 |

OTHER PUBLICATIONS

International Application No. PCT/US2008/076079, International Preliminary Report on Patentability, 6 pages, Mar. 24, 2010.
International Application No. PCT/US2008/076160, International Search Report and Written Opinion, 11 pages, Mar. 18, 2009.
International Application No. PCT/US2008/076199, International Preliminary Report on Patentability, 6 pages, Mar. 24, 2010.
International Application No. PCT/US2008/085031, International Preliminary Report on Patentability, 6 pages, Jun. 15, 2010.
International Application No. PCT/US2009/057554, International Preliminary Report on Patentability, 7 pages, Mar. 29, 2011.
International Application No. PCT/US2009/057554, International Search Report and Written Opinion, 11 pages, May 10, 2010.
International Application No. PCT/US2009/066647, International Search Report and Written Opinion, 16 pages, Jul. 1, 2010.
International Application No. PCT/US2008/076030, International Preliminary Report on Patentability, 5 pages, Mar. 16, 2010.
International Application No. PCT/US2009/041304, International Preliminary Report on Patentability, 8 pages, Nov. 6, 2010.
International Application No. PCT/US2009/041304, International Search Report and Written Opinion, 13 pages, Dec. 18, 2009.
International Application No. PCT/US2010/021824, International Search Report and Written Opinion, 9 pages, Aug. 23, 2010.
International Application No. PCT/US2010/034579, International Preliminary Report on Patentability, 6 pages, Nov. 15, 2011.
International Application No. PCT/US2010/034579, International Search Report and Written Opinion, 9 pages, Dec. 24, 2010.
International Application No. PCT/US2010/046193, International Search Report and Written Opinion, 13 pages, Apr. 26, 2011.
International Application No. PCT/US2010/059486, International Search Report and Written Opinion, 9 pages, Jul. 27, 2011.
International Search Report and Written Opinion of the International Searching Authority, International Application Serial No. PCT/US2008/076079, 11 pages, Mar. 20, 2009.
International Search Report and Written Opinion of the International Searching Authority, International Application Serial No. PCT/US2008/076199, 11 pages, Mar. 24, 2009.
International Search Report and Written Opinion of the International Searching Authority, International Application Serial No. PCT/US2008/076030, 10 pages, Mar. 23, 2009.
International Search Report and Written Opinion of the International Searching Authority, International Application Serial No. PCT/US2008/085031, 11 pages, Jun. 24, 2009.
SIPO First Office action for App No. 200880120050.6, 8 pages, Aug. 2, 2011.
Rajan et al., "Method for Heteroepitaxial growth of high quality N-Face GaN, InN and AlN and their alloys by metal organic chemical vapor deposition," U.S. Appl. No. 60/866,035, filed Nov. 15, 2006, 31 pages.

(56) References Cited

OTHER PUBLICATIONS

'SITIS Topic Details' [online] "Planar, Low Switching Loss, Gallium Nitride Devices for Power Conversion Applications, SBIR N121-090 (Navy)" 2012, [retrieved on Jan. 6, 2012], Retrieved from the Internet: URL: <http://www.dodsbir.net/sitis/display_topic.asp?Bookmark=42087>, 3 pages.

Ando et al., "10-W/mm AlGaN-GaN HFET with a field modulating plate," *IEEE Electron Device Letters*, 2003, 24(5): 289-291.

Arulkumaran et al., "Surface Passivation Effects on AlGaN/GaN High-electronmobility Transistors with $SiO_2$, $Si_3N_4$, and Silicon Oxynitride." *Applied Physics Letters* 84.4 (2004): 613.

Chen et al., "High-performance AlGaNIGaN lateral field-effect rectifiers compatible with high electron mobility transistors," Jun. 25, 2008, *Applied Physics Letters*, 92, 3 pp.

Chu, "1200-V Normally Off GaN-on-Si Field-Effect Transistors With Low Dynamic ON-Resistance." *IEEE Electron Device Letters* 32.5 (2011): 632-34.

Coffie et al., "Unpassivated p-GaNI AlGaN/GaN HEMTs with 7.1 W Imm at 10 GhZ," *Electronic Letters*, 39(19): 1419-1420, 2003.

Coffie, "Characterizing and Suppressing DC-to-RF Dispersion in AlGaN/GaN High Electron Mobility Transistors," 2003, PhD Thesis, University of California, Santa Barbara, 169 pp.

Dora et al., "High Breakdown Voltage Achieved on AlGaN/GaN HEMTs with Integrated Slant Field Plates," *IEEE Electron Device Letters*, 2006, 27(9):713-715.

Dora et al., "$ZrO_2$ gate dielectrics produced by ultraviolet ozone oxidation for GaN and AlGaN/GaN transistors," *J. Vac. Sci. Technol. B*, 2006, 24(2):575-581.

Dora, "Understanding Material and Process Limits for High Breakdown Voltage AlGaN/GaN HEMs," Diss. University of California, Santa Barbara, 2006, 157 pages.

Fanciulli et al., "Structural and Electrical Properties of $HfO_2$ Films Grown by Atomic Layer Deposition on Si, Ge, GaAs and GaN", *Mat. Res. Soc. Symp. Proc.*, 2004, 786: E6.14.1-E6.14.6.

Green et al., "The effect of surface passivation on the microwave characteristics of un doped AlGaN/GaN HEMT's," *IEEE Electron Device Letters*, Jun. 2000, 21(6): 268-270.

Gu et al., "AlGaN/GaN MOS transistors using crystalline $ZrO_2$ as gate dielectric," *Proceedings of SPIE*, 2007, vol. 6473, 64730S, 8 pp.

Higashiwaki et al., "AlGaN/GaN Heterostructure Field-Effect Transistors on 4H-SiC Substrates with Current-Gain Cutoff Frequency of 190 GHz." *Applied Physics Express* 1 (2008): 021103.

Hwang, "Effects of a Molecular Beam Epitaxy Grown AlN Passivation Layer on AlGaN/GaN Heterojunction Field Effect Transistors." *Solid-State Electronics* 48.2 (2004): 363-66.

Im et al. "Normally Off GaN MOSFET Based on AlGaN/GaN Heterostructure With Extremely High 2DEG Density Grown on Silicon Substrate." *IEEE Electron Device Letters* 31.3 (2010).

Karmalkar et al., "Enhancement of breakdown voltage in AlGaN/GaN high electron mobility transistors using a field plate," *IEEE Transactions on Electron Devices*, 48(8):1515-1521, 2001.

Karmalkar et al., "Very high voltage AlGaN/GaN high electron mobility transistors using a field plate deposited on a stepped insulator," *Solid State Electronics*, 2001, 45: 1645-1652.

Keller et al., "GaN-GaN junctions with ultrathin AlN interlayers: expanding heterojunction design," *Applied Physics Letters*, 2002, 80(23):4387-4389.

Khan et al., "AlGaN/GaN metal oxide semiconductor heterostructure field effect transistor," *IEEE Electron Device Letters*, 2000, 21 (2): 63-65.

Kim, Dong Hyun. "Process Development and Device Characteristics of AlGaN/GaN HEMTs for High Frequency Applications," 2008, 120 pages.

Kumar et al., "High transconductance enhancement-mode AlGaN/GaN HEMTs on SiC substrate," *Electronics Letters*, 2003, 39(24): 2 pgs; Online No. :20031124.

Kuraguchi et al., "Normally-off GaN-MISFET with well-controlled threshold voltage," *Phys. Stats. Sol.*, 2007, 204(6):2010-2013.

Lanford et al., "Recessed-gate enhancement-mode GaN HEMT with high threshold voltage," *Electronics Letters*, 2005, 41(7), 2 pages.

Lee et al., "Self-aligned process for emitter- and base-regrowth GaN HBTs and BJTs," *Solid-State Electronics*, 45:243-247, 2001.

Mishra et al., "AlFaN/GaN HEMTs—An Overview of Device Operation and Applications," *Proceedings of the IEEE*, 2002, 90(6):1022-1031.

Nanjo et al., "Remarkable Breakdown Voltage Enhancement in AlGaN Channel High Electron Mobility Transistors," *Applied Physics Letters* 92.26 (2008):92-94.

Ota et al., "A1GaN/GaN recessed MIS-Gate HFET with high threshold-voltage normally-off operation for power electronics applications," *IEEE Electron Device Letters*, 2008, 29(7):668-670.

Palacios et al., "Nitride-based high electron mobility transistors with a GaN spacer," *Applied Physics Letters*, 2006, 89:073508-1-3.

Palacios et al., "AlGaN/GaN HEMTs with an InGaN-based Backbarrier," *Device Research Conference Digest*, 2005, pp. 181-182.

Palacios et al., "AlGaN/GaN High Electron Mobility Transistors With InGaN Back-Barriers," *IEEE Electron Device Letters*, 2006, 27(1):13-15.

Pei et al., "Effect of Dielectric Thickness on Power Performance of AlGaN/GaN HEMTs," *IEEE Electron Device Letters*, 2009, 30(4):313-315.

Rajan et al., "Advanced transistor structures based on N-face GaN," *32M International Symposium on Compound Semiconductors (ISCS)*, 2005, Europa-Park Rust, Germany, 2 pages.

Saito et al., "Recess-Gate Structure Approach Toward Normally Off High—Voltage AlGaN/GaN HEMT for Power Electronics Applications," *IEEE Transactions on Electron Device*, 2006, 53(2): 356-362.

Shelton et al., "Selective area growth and characterization of AlGaN/GaN heterojunction bipolar transistors by metalorganic chemical vapor deposition," *IEEE Transactions on Electron Devices*, 2001, 48(3): 490-494.

Shen, "Advanced Polarization-Based Design of A1GaN/GaN HEMTs," Jun. 2004, PhD Thesis, University of California, Santa Barbara, 191 pp.

Sugiura et al., "Enhancement-mode n-channel GaN MOSFETs fabricated on p-GaN using $HfO_2$ as gate oxide," *Electronics Letters*, 2007, 43(17), 2 pp.

Suh, "High-Breakdown Enhancement-Mode AlGaN/GaN HEMTs with Integrated Slant Field-Plate," *Electron Devices Meeting*, 2006. IEDM '06. International (2006), 3 pages.

Tipirneni et al., "Silicon Dioxide-Encapsulated High-Voltage AlGaN/GaN HFETs for Power-Switching Applications," *IEEE Electron Device Letters*, 2007, 28(9): 784-86.

Vetury et al., "Direct Measurement of Gate Depletion in High Breakdown (405V) Al/GaN/GaN Heterostructure Field Effect Transistors," *IEDM*, 1998, 98: pp. 55-58.

Wang et al., "Comparison of the effect of gate dielectric layer on 2DEG carrier concentration in strained AlGaN/GaN heterostructure," *Mater. Res. Soc. Symp. Proc.*, 2005,vol. 831, 6 pp.

Wang et al., "Enhancement-Mode $SbN_4$/AlGaN/GaN MISHFETs," *IEEE Electron Device Letters*, 2006, 27(10):793-795.

Wu et al., "A 97.8% Efficient GaN HEMT Boost Converter With 300-W Output Power at 1 MHz," *IEEE Electron Device Letters*, 2008, 29(8): 824-26.

Wu. "AlGaN/GaN Microwave Power High Mobility Transistors," Diss. University of California, Santa Barbara, 1997, 134 pages.

Yoshida, "AlGan/GaN power FET," *Furukawa Review*, 2002,21:7-11.

Zhang, "High Voltage GaN HEMTs with Lowon-resistance for Switching Applicationson-resistance for Switching Applications," Diss. University of California, Santa Barbara, 2002, 166 pages.

Authorized officer Kwan Sik Sul, International Search Report and Written Opinion in PCT/US2011/063975, mailed May 18, 2012, 8 pages.

Authorized officer Sang-Taek Kim, International Search Report and Written Opinion in PCT/US2011/061407, mailed May 22, 2012, 10 pages.

Authorized officer Kwan Sik Sul, International Search Report and Written Opinion in PCT/US2012/023160, mailed May 24, 2012, 9 pages.

Authorized officer Jeongmin Choi, International Search Report and Written Opinion in PCT/US2012/027146, mailed Sep. 24, 2012, 12 pages.

(56) References Cited

OTHER PUBLICATIONS

Napierala et al. (2006), "Selective GaN Epitaxy on Si(111) Substrates Using Porous Aluminum Oxide Buffer Layers," Journal of the Electrochemical Society, 153(2):G125-G127, 4 pages.

Search Report and Action in TW Application No. 098132132, issued Dec. 6, 2012, 8 pages.

SIPO First Office Action for Application No. 200980114639.X, issued May 14, 2012, 13 pages.

Zhanghong Content, Shanghai Institute of Metallurgy, Chinese Academy of Sciences, "Two-dimensional Electron Gas and High Electron Mobility Transistor (HEMT)," Dec. 31, 1984, 17 pages.

Authorized officer Simin Baharlou, International Preliminary Report on Patentability in PCT/US2008/076160, mailed Mar. 25, 2010, 6 pages.

Authorized officer Beate Giffo-Schmitt, International Preliminary Report on Patentability in PCT/US2010/021824, mailed Aug. 18, 2011, 7 pages.

Authorized officer Philippe Bécamel, International Preliminary Report on Patentability in PCT/US2010/046193, mailed Mar. 8, 2012, 10 pages.

Authorized officer Nora Lindner, International Preliminary Report on Patentability in PCT/US2010/059486, mailed Jun. 21, 2012, 6 pages.

European Search Report in Application No. 10 81 5813.0, mailed Mar. 12, 2013, 9 pages.

Authorized officer Tae Hoon Kim, International Search Report and Written Opinion in PCT/US2013/035837, mailed Jul. 30, 2013, 9 pages.

Authorized officer Hye Lyun Park, International Search Report and Written Opinion in PCT/US2013/050914, mailed Oct. 18, 2013, 11 pages.

\* cited by examiner

SEMICONDUCTOR DEVICES WITH GUARD RINGS

TECHNICAL FIELD

This invention relates to semiconductor electronic devices, specifically devices with guard rings.

BACKGROUND

To date, most transistors used in power electronic applications have typically been fabricated with silicon (Si) semiconductor materials. Common transistor devices for power applications include Si CoolMOS, Si Power MOSFETs, and Si Insulated Gate Bipolar Transistors (IGBTs). While Si power devices are inexpensive, they suffer from a number of disadvantages, including relatively low switching speeds and high levels of electrical noise. More recently, silicon carbide (SiC) power devices have been considered due to their superior properties. III-Nitride (III-N) semiconductor devices are now emerging as an attractive candidate to carry large currents and support high voltages, and provide very low on resistance, high voltage device operation, and fast switching times. A typical III-N high electron mobility transistor (HEMT), shown in FIG. 1, comprises a substrate 10, a III-N channel layer 11, such as a layer of GaN, atop the substrate, and a III-N barrier layer 12, e.g., a layer of $Al_xGa_{1-x}N$, atop the III-N channel layer. A two-dimensional electron gas (2DEG) channel 19 is induced in the III-N channel layer 11 near the interface between the III-N channel layer 11 and the III-N barrier layer 12. Source and drain electrodes 14 and 15, respectively, form ohmic contacts to the 2DEG channel. Gate 16 modulates the portion of the 2DEG in the gate region, e.g., beneath gate 16.

In typical power switching applications for which high-voltage switching transistors are used, the transistor may be in one of two states. In the first state, which is commonly referred to as the "on state", the voltage at the gate electrode relative to the source electrode is higher than the transistor threshold voltage, and substantial current flows through the transistor. In this state, the voltage difference between the source and drain is typically low, usually no more than a few volts, e.g., about 0.1-5 volts. In the second state, which is commonly referred to as the "off state", the voltage at the gate electrode relative to the source electrode is lower than the transistor threshold voltage, and no substantial current flows through the transistor. In this second state, the voltage between the source and drain can range anywhere from about 0V to the value of the circuit high voltage supply, which in some cases can be as high as 100V, 300V, 600V, 1200V, 1700V, or higher. When the transistor is in the off state, it is said to be "blocking a voltage" between the source and drain. As used herein, "blocking a voltage" refers to the ability of a transistor, diode, device, or component to prevent significant current, e.g., current that is greater than 0.001 times the operating current during regular conduction, from flowing through the transistor, diode, device, or component when a voltage is applied across the transistor, diode, device, or component. In other words, while a transistor, diode, device, or component is blocking a voltage that is applied across it, the total current passing through the transistor, diode, device, or component will not be greater than 0.001 times the operating current during regular conduction.

When a device is operated in the off-state, large electric fields may be present in the material layers, especially when the device is a high-voltage device and is used in high-voltage applications. As used herein, a "high-voltage device", such as a high-voltage transistor or diode, is an electronic device which is optimized for high-voltage switching applications. That is, in the case the device is a high-voltage transistor, when the transistor is off, it is capable of blocking high voltages, such as about 100V or higher, about 300V or higher, about 600V or higher, about 1200V or higher, or about 1700V or higher, and when the transistor is on, it has a sufficiently low on-resistance ($R_{ON}$) for the application in which it is used, i.e., it experiences sufficiently low conduction loss when a substantial current passes through the device. In the case the device is a high-voltage diode, when the diode is reverse biased, it is capable of blocking high voltages, such as about 100V or higher, about 300V or higher, about 600V or higher, about 1200V or higher, or about 1700V or higher, and when the diode is forward biased, it has a sufficiently low on-resistance $R_{ON}$ or on-voltage $V_{ON}$ for the application in which it is used. A high-voltage device may be at least capable of blocking a voltage equal to the high-voltage supply or the maximum voltage in the circuit for which it is used. A high-voltage device may be capable of blocking 100V, 300V, 600V, 1200V, 1700V, or other suitable blocking voltage required by the application. In other words, a high-voltage device may be designed to block any voltage between 0V and at least $V_{max}$, where $V_{max}$ is the maximum voltage that could be supplied by the circuit or power supply. In some implementations, a high-voltage device can block any voltage between 0V and at least $2*V_{max}$.

Field plates are commonly used in high-voltage devices to shape the electric field in the high-field region of the device in such a way that reduces the peak electric field and increases the device breakdown voltage, thereby allowing for higher voltage operation. In a field-effect transistor (FET), the high-field region in the device is primarily in the access region between the gate and the drain, e.g., region 24 in FIG. 3. Hence, the field plate in a FET is typically placed on top of the portion of the drain access region adjacent to the drain-side edge of the gate, as seen in FIGS. 2 and 3. As used herein, the "access regions" of a transistor refer to the regions between the source and gate electrodes and between the gate and drain electrodes of the transistor, e.g., regions 23 and 24 indicated in FIG. 3. Region 23, the access region on the source side of the gate, is typically referred to as the source access region, and region 24, the access region on the drain side of the gate, is typically referred to as the drain access region. As used herein, the "gate region" of a transistor refers to the portion of the transistor between the two access regions, e.g., region 25 in FIG. 3.

Examples of field plated III-N HEMTs are shown in FIGS. 2 and 3. In addition to the layers included in the device of FIG. 1, the device in FIG. 2 includes a field plate 18 which is connected to gate 16, and an insulator layer 13 (e.g., a layer of SiN) that is at least partially between the field plate and the barrier layer 12. Field plate 18 can include or be formed of the same material as gate 16, or it can alternatively be formed of a different conducting material or layer. Insulator layer 13 can act as a surface passivation layer, preventing or suppressing voltage fluctuations at the surface of the III-N material adjacent to insulator layer 13. FIG. 3 shows an example of a III-N HEMT with a slant field plate. The device of FIG. 3 is similar to that of FIG. 2, except that the insulator layer 13 includes a slanted edge 26 on the drain side of the gate, and the field plate 28 is on top of and contacting the slanted edge 26; hence the field plate 28 is referred to as a slant field plate. The slanted edge 26 includes at least a substantial portion which is at a non-perpendicular angle to a main surface of the semiconductor material structure 32. Alternative field plate structures to those shown in FIGS. 2 and 3 have also been used.

In order for a field plate to effectively minimize the peak electric field when the device is blocking a voltage, it is electrically connected to a supply of mobile charge, which is typically accomplished by electrically connecting the field plate to the gate electrode, as shown in FIGS. 2-3, or in some cases by electrically connecting the field plate to the source electrode. As used herein, two or more contacts or other elements such as conductive layers or components are said to be "electrically connected" if they are connected by a material which is sufficiently conducting so that the electric potential at each of the contacts or other elements will be similar, e.g., about the same or substantially the same, after a period of time. Elements which are not electrically connected are said to be "electrically isolated". Electrically isolated elements, although not maintained at substantially the same potential at all times, can be capacitively or inductively coupled.

While field plates have been shown to enable III-N HEMTs with very large breakdown voltages, they can cause an increase in the input capacitance (gate capacitance) of the transistor, resulting in slower transistor speeds and, in the case of power switching applications, larger gate currents during switching. In order to enable devices with even higher operating voltages and/or breakdown voltages than those which are currently possible with modern field plate structures, as well as improving other aspects of device performance, additional improvements in device design are necessary.

SUMMARY

Semiconductor devices with guard rings are described. The semiconductor devices may be, e.g., transistors and diodes designed for high-voltage applications. A guard ring is a floating electrode formed of electrically conducting material above a semiconductor material layer. A portion of an insulating layer is between a portion of the guard ring and the semiconductor material layer. A guard ring may be located, for example, on a transistor between a gate and a drain electrode. A semiconductor device may have one or more guard rings.

In one aspect, a semiconductor transistor is described. The transistor includes a semiconductor material layer, a conductive channel in the semiconductor material layer, a source electrode and a drain electrode contacting the conductive channel, a gate between the source electrode and the drain electrode, an insulating layer on a surface of the semiconductor material layer, and a guard ring above the semiconductor material layer and between the gate and the drain electrode. The guard ring includes or is formed of an electrically conductive material which is electrically isolated from the source electrode, the drain electrode, and the gate. A portion of the insulating layer is between at least a portion of the guard ring and the semiconductor material layer.

In another aspect, a semiconductor diode is described. The diode includes a semiconductor material layer, a conductive channel in the semiconductor material layer, a cathode, and an anode. The cathode contacts the conductive channel. The diode further includes an insulating layer on a surface of the semiconductor material layer and a guard ring above the semiconductor material layer and between the cathode and the anode. The guard ring includes or is formed of an electrically conductive material which is electrically isolated from the cathode and the anode.

The transistors and diodes described herein can include one or more of the following. The guard ring can include a field mitigating portion. The field mitigating portion can include or be formed of electrically conductive material extending from the guard ring towards the drain electrode or the cathode. The guard ring can include a main portion extending from a top of the insulating layer towards a bottom of the insulating layer, with the field mitigation portion substantially perpendicular to the main portion and extending from the main portion towards the drain electrode. The field mitigating portion can be formed on top of first and second separating portions of the insulating layer, and where the first separating portion is narrower than the second separating portion. The field mitigating portion can be slanted, being formed around a via in the insulating layer that is narrower towards the bottom of the insulating layer and wider towards the top of the insulating layer. The semiconductor transistor or diode can further include one or more additional guard rings between the guard ring and the drain electrode or the cathode. The guard ring may not be electrically connected to (i.e., may be electrically isolated from) any DC and/or AC voltage sources. The guard ring can extend from a top of the insulating layer towards a bottom of the insulating layer without contacting the semiconductor material layer. The minimum separation between the guard ring and the semiconductor material layer can be at least 20 nanometers. The guard ring can extend from a top of the insulating layer towards a bottom of the insulating layer and contact the semiconductor material layer. The guard ring can be a distance from the gate or the anode where a depletion region in the semiconductor material layer extends prior to or at breakdown of the transistor or diode in a similar transistor or diode which lacks the guard ring. The transistor or diode can further include a field plate. The field plate can be electrically connected to the gate or the anode. The field plate can include or be formed of electrically conducting material contacting the gate or anode and extending from the gate or anode towards the drain electrode or the cathode. The field plate can be slanted, being formed around a via in the insulating layer that is narrower towards a bottom of the insulating layer and wider towards a top of the insulating layer. The transistor or diode can be a III-N device. The semiconductor material layer can include a III-N channel layer and a III-N barrier layer above the III-N channel layer. The conductive channel can be a two-dimensional electron gas (2DEG) channel induced in the III-N channel layer near the interface between the III-N channel layer and the III-N barrier layer. The III-N channel layer can include a layer of GaN. The III-N barrier layer can include a layer of $Al_xGa_{1-x}N$. The transistor or diode can be a high-voltage device.

In yet another aspect, a method of manufacturing a semiconductor transistor is described. The method includes forming a semiconductor material layer on a substrate, forming an insulating layer on top of the semiconductor material layer, adding source and drain electrodes contacting a conductive channel in the semiconductor material layer, etching the insulating layer to receive a deposition of conductive material, and depositing conductive material to form a gate between the source electrode and the drain electrode and a guard ring between the gate and the drain electrode. The guard ring is electrically isolated from the source electrode, the drain electrode, and the gate, and a portion of the insulating layer is between at least a portion of the guard ring and the semiconductor material layer.

In still another aspect, a method of manufacturing a semiconductor diode is described. The method includes forming a semiconductor material layer on a substrate, forming an insulating layer on top of the semiconductor material layer, and adding a cathode and an anode. The cathode contacts a conductive channel in the semiconductor material layer. The method further includes etching the insulating layer to receive a deposition of conductive material, and depositing conductive material to form a guard ring between the cathode and the anode, such that the guard ring is electrically isolated from the cathode and the anode.

Methods of manufacturing semiconductor transistors or diodes can include one or more of the following. Etching the insulating layer can include etching the insulating layer so that the guard ring is a distance from the gate or anode where a depletion region in the semiconductor material layer extends prior to or at breakdown of the transistor or diode in a similar transistor or diode which lacks the guard ring. Etching the insulating layer can include etching the insulating layer to define a guard ring including a field mitigating portion extending from the guard ring towards the drain electrode or the cathode. The field mitigating portion can include a plurality of perpendicular field mitigating portions between the top of the insulating layer and the bottom of the insulating layer, each perpendicular field mitigating portion extending perpendicularly from the main portion towards the drain electrode. The field mitigating portion can be slanted, being formed around a via in the insulating layer that is narrower towards the bottom of the insulating layer and wider towards the top of the insulating layer. Etching the insulating layer can include etching the insulating layer to define one or more additional guard rings between the guard ring and the drain electrode or the cathode. Etching the insulating layer can include etching the insulating layer to define a field plate. The methods can further include depositing conductive material so that the field plate is electrically connected to the gate or the anode. Forming the semiconductor material layer can include forming a III-N channel layer and a III-N barrier layer above the III-N channel layer. The guard ring may not be electrically connected to (i.e., may be electrically isolated from) any DC and/or AC voltage sources.

Particular embodiments of the subject matter described in this specification can be implemented so as to realize one or more of the following advantages. Semiconductor devices including guard rings may have increased breakdown voltages. The breakdown voltage of a semiconductor device may be increased without increasing the capacitance of the device at lower voltages. Semiconductor devices with higher breakdown voltages may be manufactured in fewer steps.

The details of one or more embodiments of the subject matter described in this specification are set forth in the accompanying drawings and the description below. Other features, aspects, and advantages of the subject matter will become apparent from the description, the drawings, and the claims.

DESCRIPTION OF DRAWINGS

Like reference symbols in the various drawings indicate like elements.

DETAILED DESCRIPTION

Figure 1:
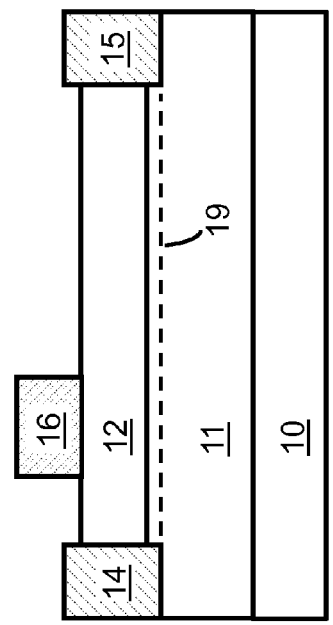
FIG. 1 illustrates a III-N high electron mobility transistor.
Figure 2:
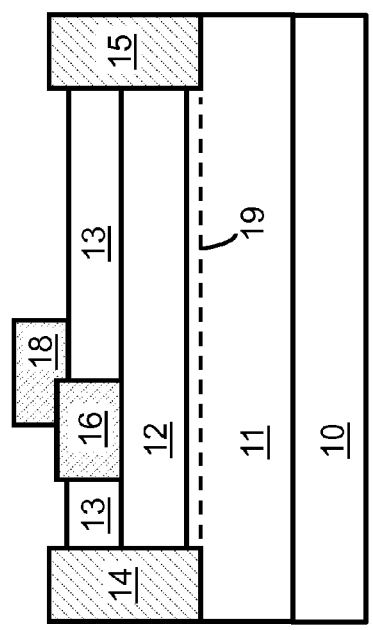
FIG. 2 illustrates a III-N high electron mobility transistor including a field plate.
Figure 3:
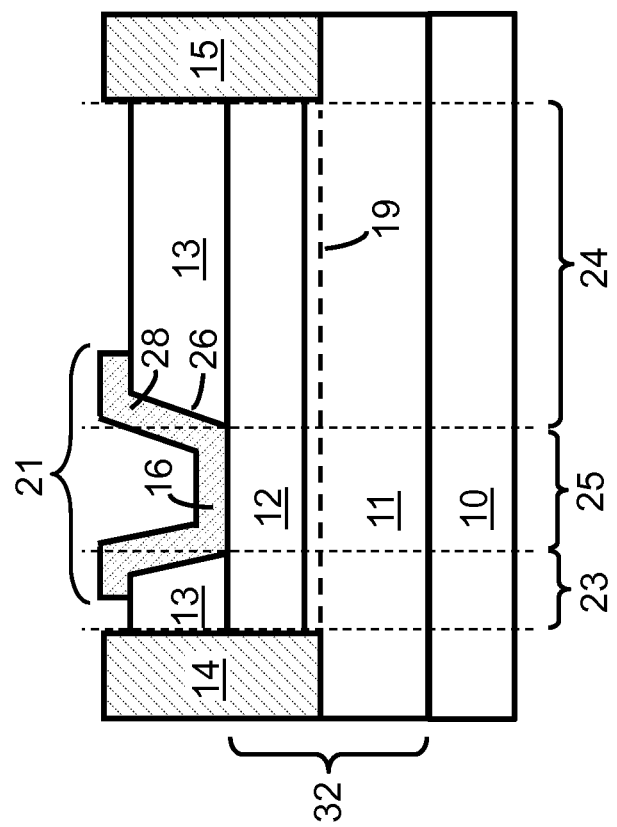
FIG. 3 illustrates a III-N high electron mobility transistor including a slant field plate.

FIGS. 4-8 illustrate example transistors 1 that include a source electrode 14, a drain electrode 15, source and drain access regions 23 and 24, a gate region 25, a gate 16 in the gate region 25 between the source electrode 14 and the drain electrode 15, a guard ring (labeled 33 in FIGS. 4 and 5, 33' in FIG. 6, 33" in FIGS. 7, and 33''' in FIG. 8) in the drain access region 24 between the gate 16 and the drain electrode 15, and optionally a field plate 48 which is in the drain access region 24 and is electrically connected to the gate 16, or alternatively can be electrically connected to the source electrode 14.

The transistor 1 may be a lateral device, a III-N device, an enhancement-mode device (threshold voltage >0V), a depletion-mode device (threshold voltage <0V), a high-voltage device, or any combination of these devices. III-N devices may be III-polar (III-face) devices, N-polar (N-face) devices or semipolar devices. A Ga-face, III-face or III-polar III-N device may include III-N materials grown with a group III-face or a [0 0 0 1] face furthest from the growth substrate, or may include source, gate, or drain electrodes on a group III face or [0 0 0 1] face of the III-N materials. A nitrogen-face, N-face or N-polar III-N device may include III-N materials grown with an N-face or [0 0 0 1 bar] face furthest from the growth substrate, or may include source, gate, or drain electrodes on an N-face or [0 0 0 1 bar] face of the III-N materials.

Various conventional III-N high electron mobility transistors (HEMTs) and related transistor devices are normally on, e.g., have a negative threshold voltage, which means that they can conduct current at zero gate voltage. These devices with negative threshold voltages are known as depletion-mode (D-mode) devices. It may be useful in power electronics to have normally off devices, e.g., devices with positive threshold voltages, that cannot conduct current at zero gate voltage. For example, normally off devices may be useful to avoid damage to the device or to other circuit components by preventing accidental turn on of the device. Normally off devices are commonly referred to as enhancement-mode (E-mode) devices.

Guard ring 33 is formed of a conducting material, e.g., nickel, titanium, platinum, gold, aluminum, poly-silicon, or another metal or other conducting material, or a combination of various conducting materials. Guard ring 33 may be formed of the same conducting material as the gate 16. Guard ring 33 is a floating electrode—it is not electrically connected to (i.e., it is electrically isolated from) the source electrode 14, the drain electrode 15, and the gate 16. In general, guard ring 33 is not electrically connected to any DC or AC voltage source, or to a DC or AC ground.

FIGS. 4-8 illustrate various example configurations of the guard ring 33. In FIGS. 4-8, guard ring 33 is positioned in transistor 1 so that at least a portion of an insulating layer 13 is between at least a portion of the guard ring 33 and the semiconductor material layer 12. A portion of the insulating layer 13 is also between at least a portion of the guard ring 33 and the conducting 2DEG channel 19. The portion of insulating layer 13 between guard ring 33 and semiconductor material layer 12 (or between guard ring 33 and conducting 2DEG channel 19) is useful, for example, in that it can allow for the guard ring 33 to include a field mitigating portion, as described below, which can prevent material near the guard ring 33 from breaking down during high voltage operation of the transistor 1.

Figure 9:
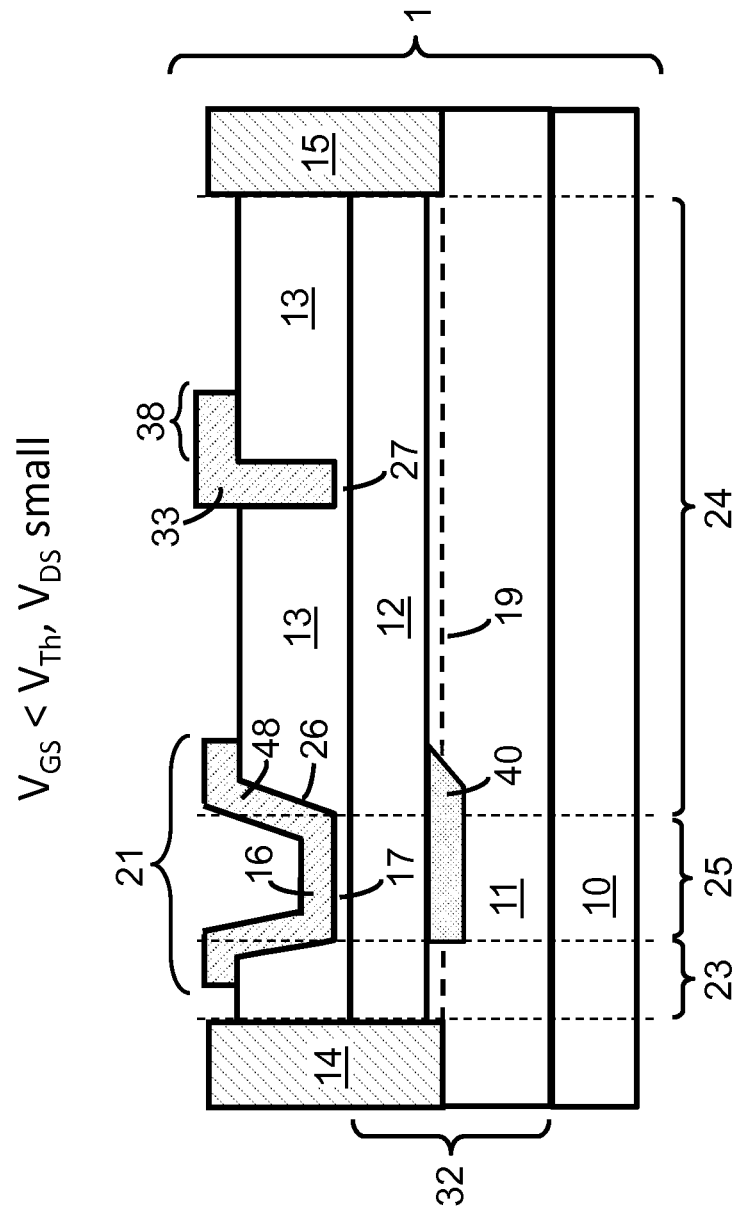
FIGS. 9-10 illustrate a depletion region in an example transistor.
Figure 10:
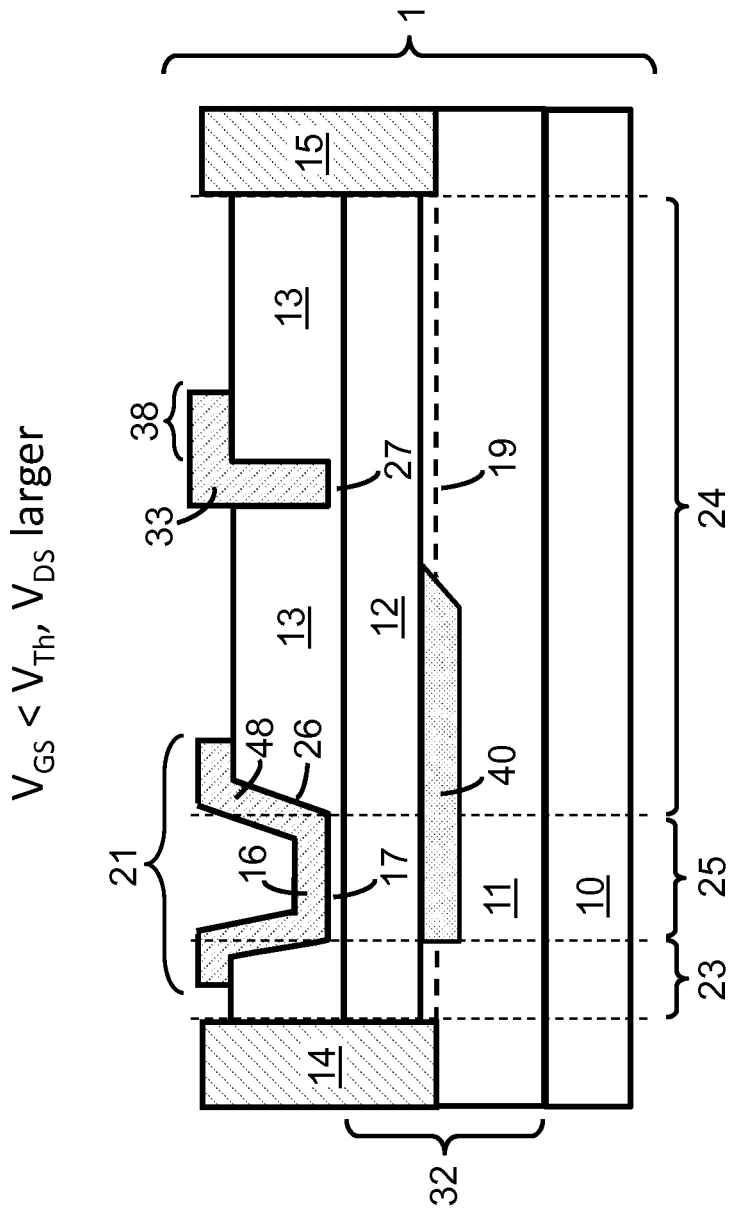

During operation of transistor 1, guard ring 33 shapes the electric field in transistor 1 to reduce the peak electric field and increase the device breakdown voltage, thereby allowing for higher voltage operation. Consider an example scenario where transistor 1 is off (i.e., the voltage applied to the gate 16 relative to the source 14 is less than the threshold voltage of the device) and an applied voltage across source 14 and drain 15 is increased over time. When the applied source-drain voltage is small (e.g., substantially less than the breakdown voltage of transistor 1), as illustrated in FIG. 9, no substantial current flows between source 14 and drain 15 because the transistor is off. A depletion region 40 exists below gate 16 (e.g., in 2DEG channel 19), and the 2DEG channel below the gate is substantially depleted of carriers. Under this bias condition, the voltage of the guard ring 33 is approximately the same as the voltage on the drain 15. As shown in FIG. 10, as the applied drain-source voltage increases, the depletion region extends towards guard ring 33, and the voltage of the guard ring 33 (relative to the source) increases so that the guard ring voltage remains close to or approximately equal to the drain voltage. The peak electric field in the semiconductor material layers also increases. The peak electric field does, however, stay below the breakdown field of the device semiconductor layers.

When the applied source-drain voltage is increased such that the depletion region extends all the way to guard ring 33, the voltage of guard ring 33 is clamped. That is, the voltage of the guard ring 33 remains about the same even as the applied source-drain voltage is further increased. Furthermore, as the applied source-drain voltage is further increased, the depletion region continues to extend towards drain 15, and charge on the guard ring 33 redistributes such that there is a net negative charge on the surface close to the depletion region and net positive charge on other surfaces of guard ring 33. This redistribution of charge causes the electric field profile in the device semiconductor layers to be modified, and can cause a reduced peak electric field in transistor 1 as compared to a similar device which lacks a guard ring. As a result, the breakdown voltage of the transistor 1 can be larger as a result of inclusion of the guard ring 33.

Figure 6:
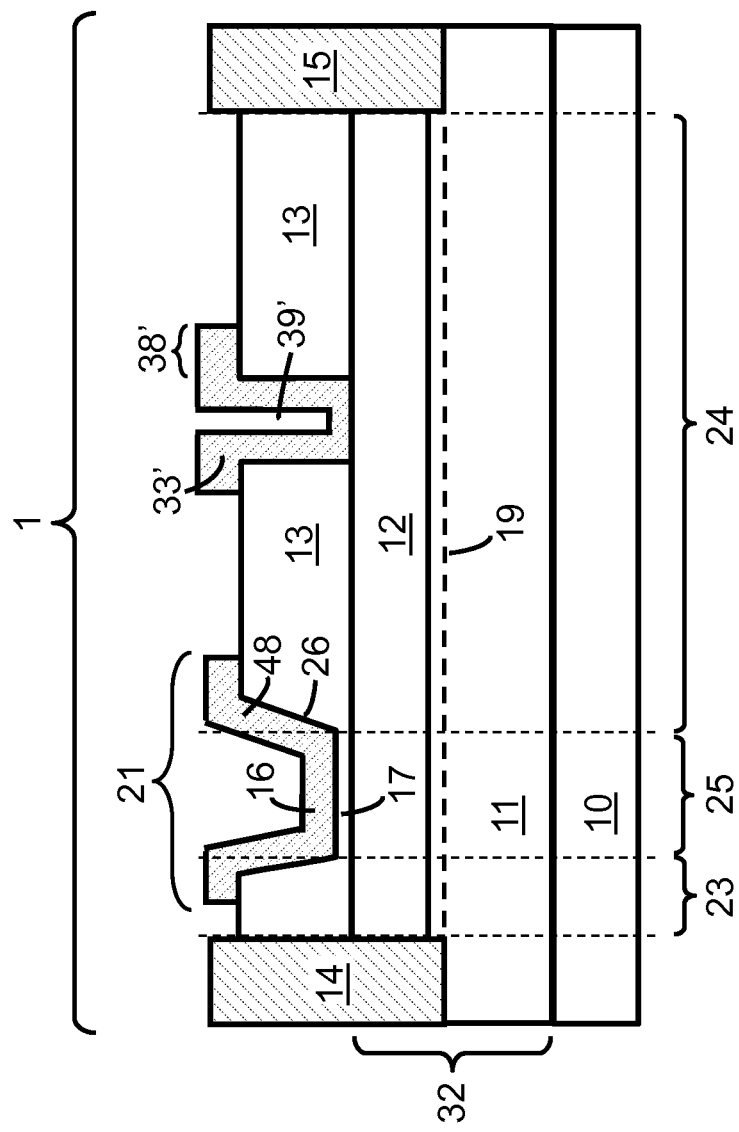
FIG. 6 is a schematic cross-sectional view of an example transistor including a second example guard ring.
Figure 7:
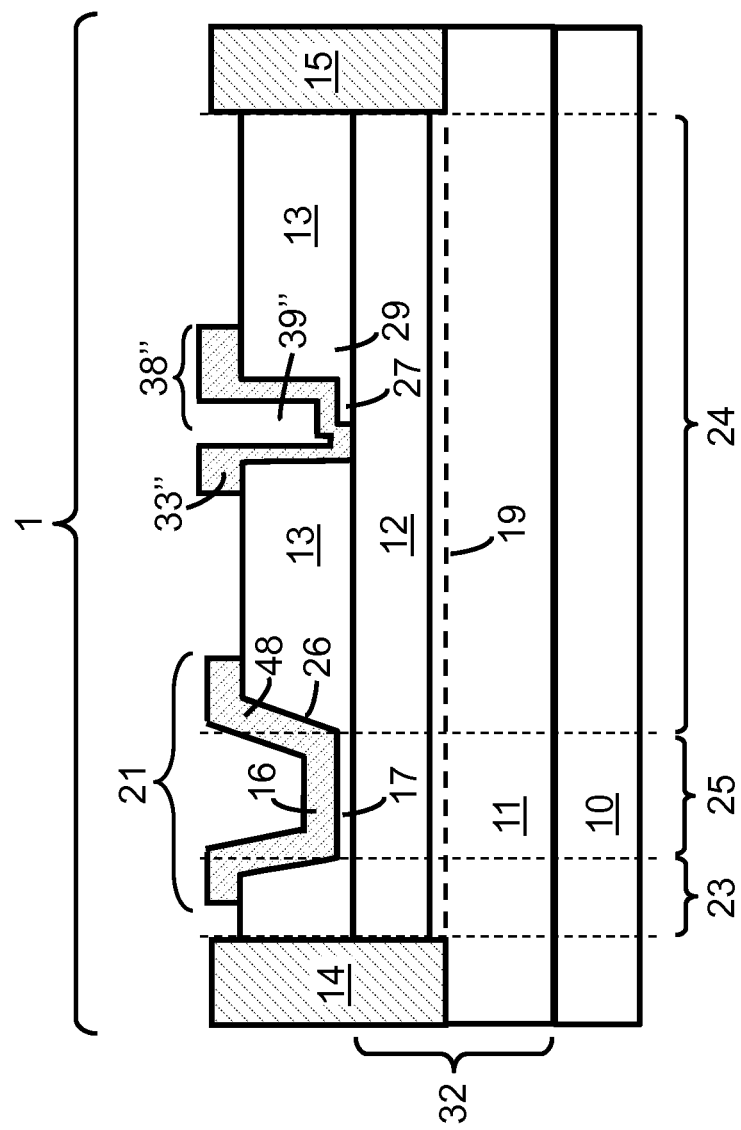
FIG. 7 is a schematic cross-sectional view of an example transistor including a third example guard ring.
Figure 8:
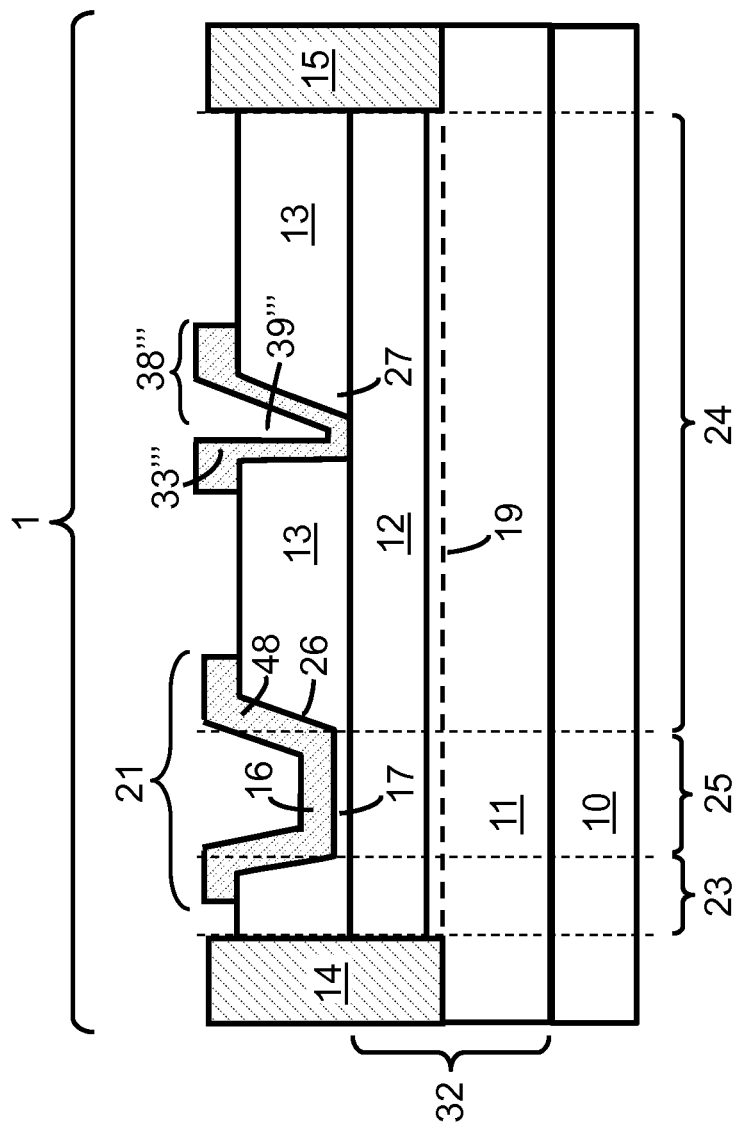
FIG. 8 is a schematic cross-sectional view of an example transistor including a fourth example guard ring.

In general, the net charge on the guard ring 33 remains constant during device operation. That is, no net charge is transferred to or from the guard ring 33 during device operation; instead, charge redistributes within or along the surface of the guard ring 33. However, if a portion of the guard ring 33 contacts the underlying semiconductor material (for example layer 12 in FIGS. 6-8), then net charge may be transferred to or from the guard ring 33 during device operation. For example, when the transistor 1 in FIGS. 6-8 is biased in the off state with a sufficiently large drain-source voltage to cause the depletion region 40 (shown in FIGS. 9-10) to extend underneath the guard ring 33, electrons from the transistor channel 19 may leak or be injected into (or onto the surface of) the guard ring 33. Charge transfer in this manner may also occur in structures where the guard ring does not directly contact the underlying semiconductor material, but the separation between the guard ring and semiconductor material is small. For example, in the structure of FIG. 5, if region 27 of insulating layer 13 is thin, such as less than 100 nanometers, less than 50 nanometers, less than 20 nanometers, less than 10 nanometers, less than 5 nanometers, or less than 2 nanometers, charge transfer as described above may occur. On the other hand, if the minimum separation between the guard ring 33 and the underlying semiconductor layer is sufficiently large, such as greater than 10 nanometers, greater than 20 nanometers, greater than 50 nanometers, greater than 100 nanometers, greater than 1 micron, or greater than 2 microns, then charge transfer to or from the guard ring 33 may be suppressed and/or eliminated. The minimum separation required to suppress and/or eliminate charge transfer may depend on a number of factors, including the exact configuration of the guard ring 33, and the material composition(s) of the guard ring, the underlying semiconductor material, and/or the material between the guard ring and the underlying semiconductor material.

Charge transfer into or onto the guard ring 33 during off-state operation, as described above, may degrade device performance, since it can lead to undesirable effects such as dispersion (for example, DC-to-RF dispersion) or increased switching times. For example, if the charge transferred into the guard ring 33 when the transistor 1 is biased in the off-state is not quickly removed or transferred out of the guard ring 33 when the gate voltage of transistor 1 is switched from low to high, the transistor 1 will not be immediately switched into the on-state. Rather, some amount of time (referred to as the transistor switching time) will elapse after the gate voltage is switched from low to high, during which time the guard ring 33 is discharged. Large switching times can lead to higher switching losses in the devices, as well as other undesirable effects.

When the applied source-drain voltage is large enough to cause the voltage at guard ring 33 to clamp, guard ring 33 can act like a field plate, reducing the peak electric field in transistor 1. Like a field plate, the entire guard ring 33 is at substantially uniform potential, which can result in a reduced peak electric field in the transistor 1. However, in many cases, no net charge is transferred to or from guard ring 33, unlike in a field plate. Because the peak electric field in the material layers of transistor 1 is reduced, the breakdown voltage of transistor 1 is increased.

Referring again to FIGS. 9 and 10, before the depletion region extends all the way to guard ring 33, the voltage at guard ring 33 is substantially the same as the voltage at drain 15, and transistor 1 operates as though it would without a guard ring. That is, the electric field distribution within the device material layers is substantially the same as that of a device lacking the guard ring but otherwise identical to the one illustrated. Furthermore, before the depletion region extends to guard ring 33 and while the voltage at guard ring 33 is substantially the same as the voltage at drain 15, guard ring 33 does not substantially alter the gate capacitance of transistor 1. This is useful, for example, because guard ring 33 can increase the breakdown voltage of transistor 1 without changing its capacitance (e.g., as some field plates do) during times where the applied source-drain voltage to transistor 1 is below the voltage that causes the depletion region to extend to guard ring 33. Increased capacitance may degrade performance of transistor 1 or the circuit in which it is used, e.g., in higher frequency or high power switching applications.

When the applied voltage exceeds the voltage that causes the depletion region to extend to guard ring 33, guard ring 33 may alter the gate capacitance of transistor 1 in much the same way that inclusion of a field plate increases the gate capacitance of a transistor. The guard ring 33 therefore offers the following advantages as compared to a field plate. During the times that the transistor is biased off and supports large source-drain voltages, the guard ring reduces the peak electric field in the device and prevents breakdown of the device, similar to a field plate. However, during times where the source-drain voltage is small (that is, small enough so that the depletion region does not extend all the way to the guard ring), the gate capacitance of the transistor is smaller, which can result in higher switching speeds and lower switching losses.

In some implementations, guard ring 33 is placed between gate 16 and drain 15 at a specific location so that the depletion region in the channel during off-state operation extends to guard ring 33 at or slightly below the breakdown voltage of a similar transistor which lacks a guard ring 33. For example, the distance from gate 16 where the depletion region extends when a transistor which lacks a guard ring breaks down may be determined using analytical methods or testing. Transistor 1 is then formed by placing a guard ring 33 at or before (e.g., slightly before) that distance from gate 16.

Figure 4:
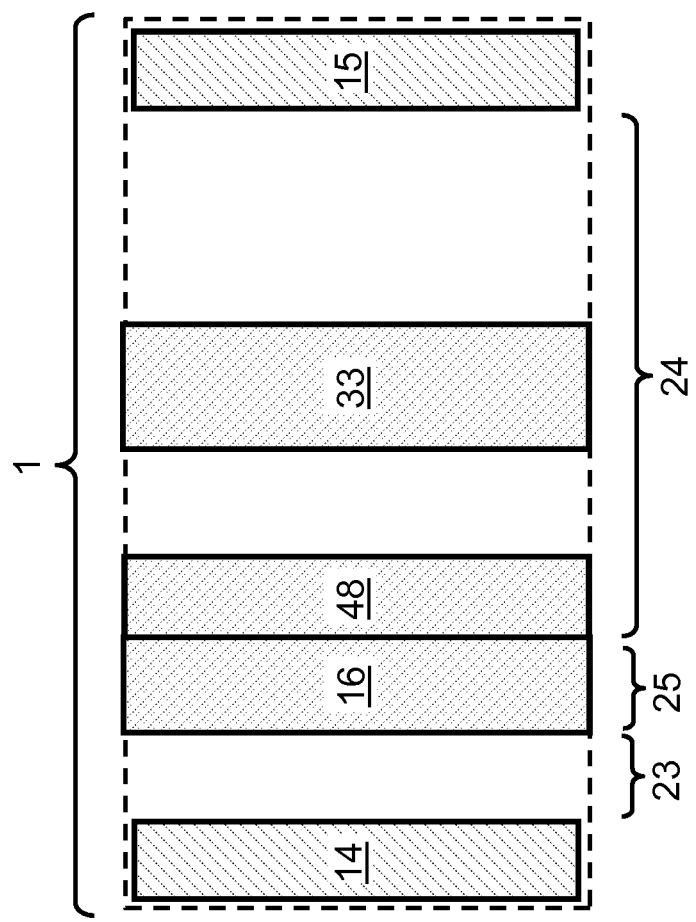
FIG. 4 is a schematic overhead view of an example transistor including a guard ring.

FIG. 4 is a schematic overhead view of an example transistor 1 including a guard ring 33. FIG. 4 illustrates source electrode 14, drain electrode 15, source and drain access regions 23 and 24, gate region 25, gate 16, field plate 48, and guard ring 33.

Figure 5:
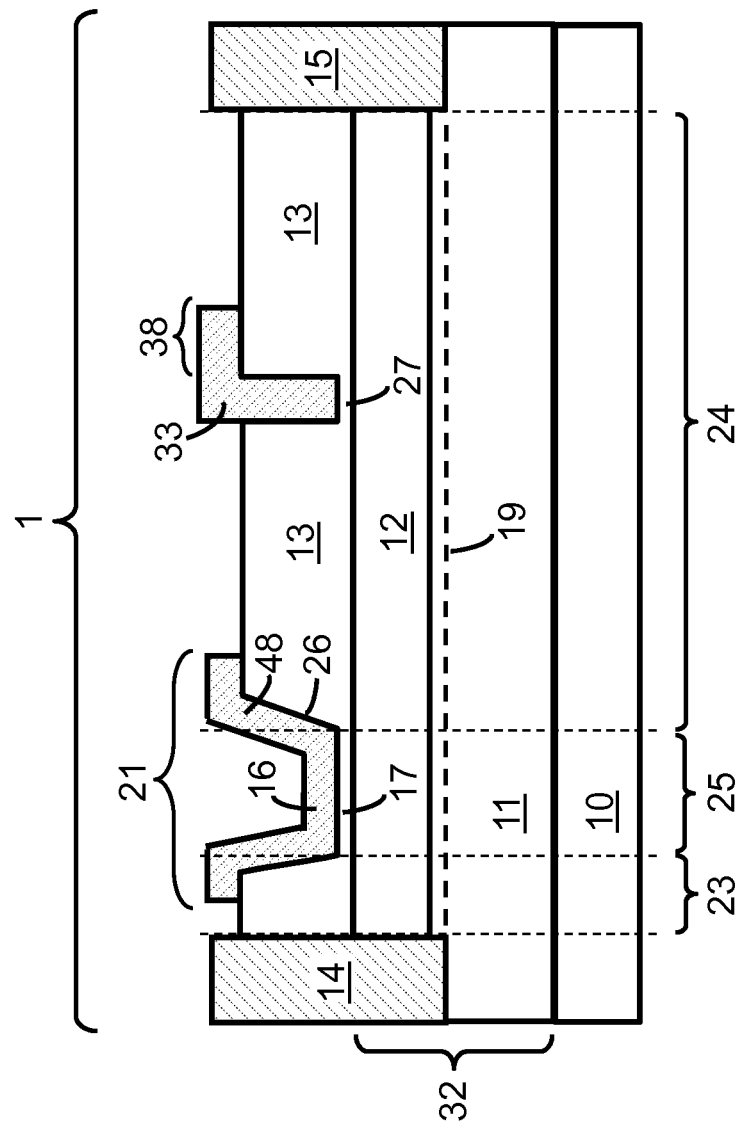
FIG. 5 is a schematic cross-sectional view of an example transistor including a first example guard ring.

FIG. 5 is a schematic cross-sectional view of an example transistor 1 including a first example guard ring 33. The transistor 1 includes, for example, a substrate 10, a III-N channel layer 11, e.g., a layer of GaN, atop the substrate, and a III-N barrier layer 12, e.g., a layer of $Al_xGa_{1-x}N$, atop the III-N channel layer. FIGS. 5-8 will be described as though transistor 1 is a III-N device; however, other semiconductor materials may be used.

A two-dimensional electron gas (2DEG) channel 19 is induced in the III-N channel layer 11 near the interface between the III-N channel layer 11 and the III-N barrier layer 12. Source and drain electrodes 14 and 15, respectively, form ohmic contacts to the 2DEG channel 19. Substrate 10 may include or be formed of, for example, silicon, sapphire, GaN, AN, SiC, or any other substrate suitable for use in III-N devices. In some implementations, a substrate is not included. For example, in some implementations the substrate is removed prior to completion of device fabrication.

Guard ring 33 includes a main portion extending from a top of insulating layer 13 towards a bottom of insulating layer 13 and a field mitigating portion 38. Guard ring 33 extends towards the bottom of insulating layer 13 without contacting semiconductor material layer 12. A separating portion 27 of insulating layer 13 separates guard ring 33 from semiconductor material layer 12. Because guard ring 33 does not contact semiconductor material layer 12, transistor 1 may, in some applications, be affected by dispersion. In III-N devices, voltage fluctuations at uppermost III-N surfaces, often caused by the charging of surface states during device operation, are known to lead to effects such as dispersion. Dispersion refers to a difference in observed current-voltage (I-V) characteristics when the device is operated under RF or switching conditions as compared to when the device is operated under DC conditions.

Field mitigating portion 38 includes electrically conductive material extending from guard ring 33 towards drain electrode 15. Field mitigation portion 38 is substantially perpendicular to the main portion. In operation, field mitigation portion 38 affects transistor 1 by shaping the electric field in the high-field region of the device to reduce the peak electric field and increase the device breakdown voltage, thereby allowing for higher voltage operation.

FIG. 6 is a schematic cross-sectional view of an example transistor 1 including a second example guard ring 33'. Guard ring 33' extends from a top of insulating layer 13 towards a bottom of insulating layer 13 and contacts semiconductor material layer 12. Because guard ring 33' contacts semiconductor material layer 12, dispersion may be reduced. Guard ring 33' also includes a gate-side portion extending at the top of guard ring 33' towards the gate 14. The gate-side portion may be intentional or a result of alignment error during manufacturing. Guard ring 33' also includes a field mitigating portion 38' extending over the top of layer 13 towards the drain 15.

Guard ring 33' can be formed around a via 39'. Via 39' extends from the top of guard ring 33' towards the semiconductor material layer 12. Via 39' has about the same width towards the top of guard ring 33' as it does towards the semiconductor material layer 12 (e.g., via 39' has sidewalls that are substantially parallel.) The via 39' may result, for example, when the guard ring 33' is deposited conformally over the insulating layer 13.

FIG. 7 is a schematic cross-sectional view of an example transistor 1 including a third example guard ring 33". Guard ring 33" includes a main portion contacting the semiconductor material layer 12 on a side towards the gate 16. Guard ring 33" includes a field mitigating portion 38" on a side towards the drain 15. Field mitigating portion 38" is formed on top of first and second separating portions 27 and 29 of the insulating layer 13. The first separating portion 27 is narrower than the second separating portion 29. This results in a via 39'" having a step at the end towards the insulating layer 12.

FIG. 8 is a schematic cross-sectional view of an example transistor 1 including a fourth example guard ring 33'''. The guard ring includes a slanted field mitigating portion 38'''. The via 39'" in insulating layer 13 in which the guard ring is formed is narrower towards a bottom of insulating layer 13 and wider towards a top of insulating layer 13. At least one of the sidewalls of via 39'" is a slanted sidewall. FIG. 8 shows the sidewall on the drain side of the via (i.e., the sidewall closest to the drain 15) as being slanted; however, the sidewall on the gate side of the via may be slanted in addition to or instead of the sidewall on the drain side being slanted. As compared to a guard ring without a slanted field-mitigating portion, the slanted field mitigating portion 38'" can further reduce the peak field in the device when the device is biased such that the channel depletion region extends beyond the drain-side edge of the guard ring, thereby further increasing the device breakdown voltage and improving device reliability.

Features of guard rings shown in FIGS. 5-8 may be used individually or in combination with one another. For example, a guard ring may not directly contact the underlying semiconductor materials, as in FIG. 5, but may have a slanted field mitigating portion, as in FIG. 8. Or, a guard ring may include a series of steps, as in FIG. 7, where one or more of the steps include slanted sidewalls, as in FIG. 8. Other combinations are possible.

Figure 11:
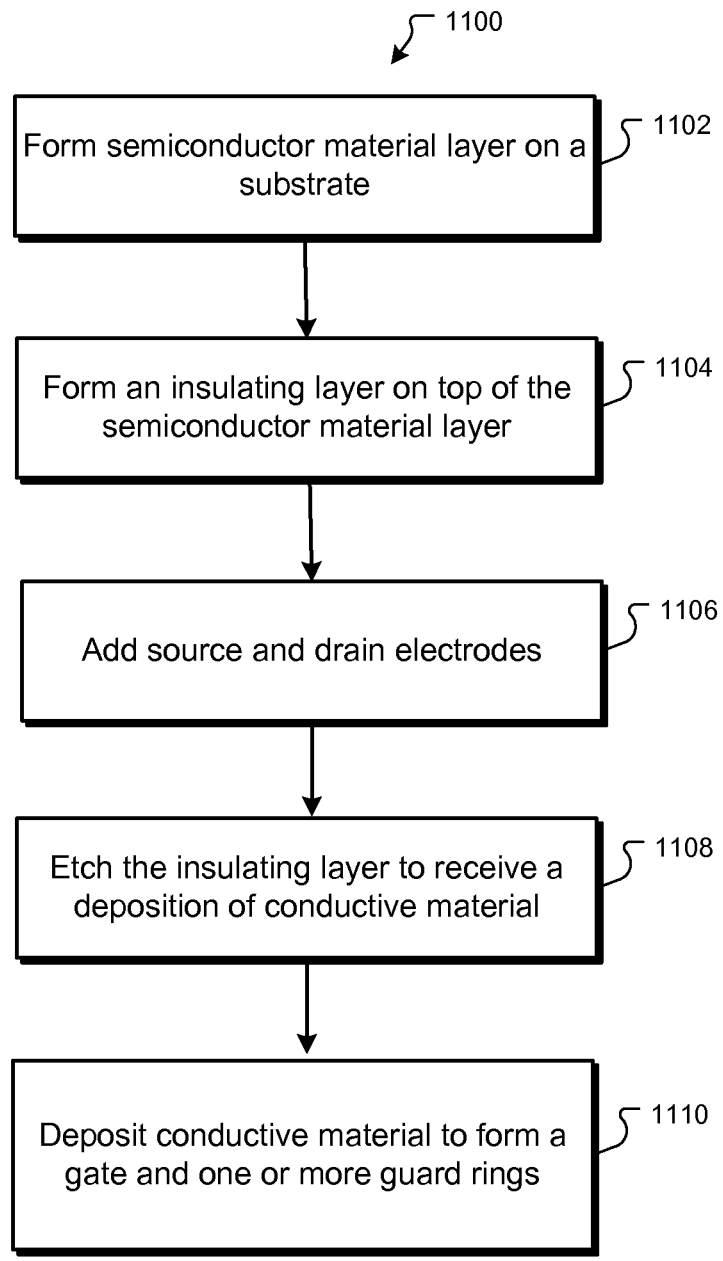
FIG. 11 is a flow diagram of a process for manufacturing a transistor including a guard ring.

FIG. 11 is a flow diagram of a process 1100 for manufacturing a transistor including a guard ring. The process 1100 may be performed, for example, to create one of the example transistors 1 of FIGS. 4-8.

A semiconductor material layer including a conductive channel is formed on a substrate (step 1102). For example, a series of III-N layers including a channel layer and a barrier layer may be formed on the substrate, resulting in the formation of a 2DEG in the channel layer. The III-N layers may be grown epitaxially, e.g., by MOCVD, MBE, HVPE, or another method.

An insulating layer is formed on top of the semiconductor material layer (step 1104). For example, the insulating layer may be grown or deposited by MOCVD, PECVD, high temperature CVD (HTCVD), sputtering, evaporation, or another method. In some embodiments, the insulating layer is formed by a similar or the same method as the semiconductor material layer, and can be formed in the same step. For example, the semiconductor material layer and the insulating layer can all be deposited or grown by MOCVD.

Source and drain electrodes are added to the transistor (step 1106). The source and drain electrodes contact the conductive channel in the semiconductor material layer. For example, the insulating layer may be removed in regions to receive the source and drain electrodes, and then the source and drain electrodes may be formed by evaporation, sputtering, PECVD, HTCVD, or another method. In some implementations, the source and drain electrodes are formed prior to the formation of the insulating layer. In other implementations, the insulating layer includes a first portion and a second portion, the first portion being formed prior to formation of the source and drain electrodes, and the second portion being formed after formation of the source and drain electrodes.

The insulating layer is etched to receive a deposition of conductive material (step 1108). The insulating layer is etched to define regions to receive a gate and one or more guard rings. The gate is between the source electrode and the drain electrode, and the guard rings are between the gate and the drain. In some implementations, the guard ring is a distance from the gate where a depletion region in the semiconductor material layer would extend prior to or at breakdown of the transistor. In some implementations, the insulating layer is etched to define a region to receive a field plate.

Conductive material is deposited over the insulating layer to form a gate and one or more guard rings (step 1110). The guard rings may be, for example, any of the guard rings 33 illustrated in FIGS. 4-8. Each guard ring is electrically isolated from the source electrode, the drain electrode, and the gate. At least a portion of the insulating layer is between at least a portion of each guard ring and the semiconductor material layer. In some implementations, conductive material is deposited over the insulating layer to form a field plate.

Figure 12:
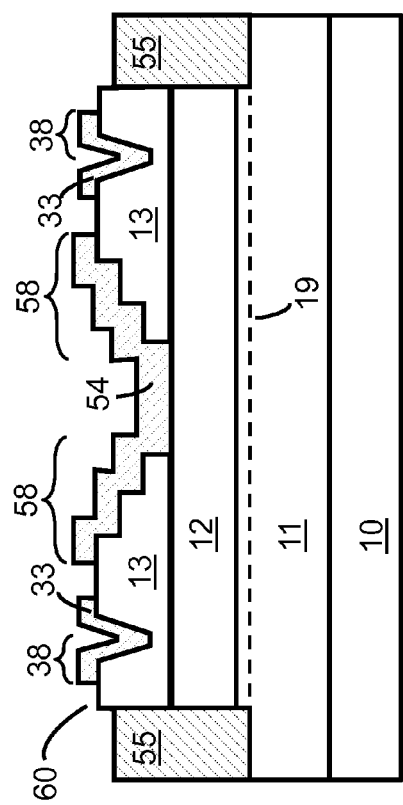
FIGS. 12-13 illustrate an example diode that includes a guard ring.
Figure 13:
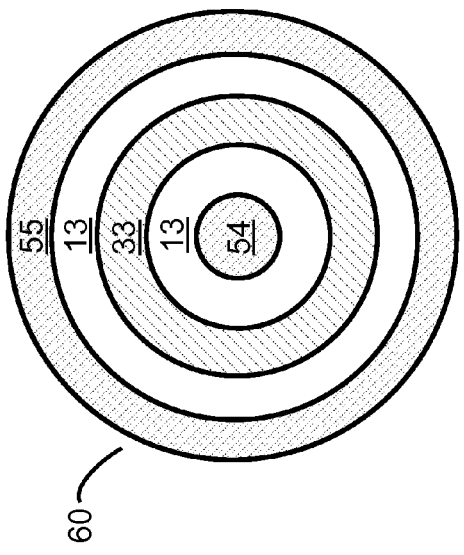

The process 1100 is useful, for example, for producing high-voltage devices. Instead of adding additional field plates to increase the breakdown voltage of a transistor, a guard ring or additional guard rings may be added. Adding additional field plates typically requires additional depositions, whereas multiple guard rings may be added and formed in a single deposition along with a gate and a field plate FIGS. 12-13 illustrate an example diode 60 that includes a guard ring 33. FIG. 12 is a cross-sectional view of the diode 60, and FIG. 13 is a top view (plan view) of the diode 60. The diode 60 includes, for example, a substrate 10, a III-N channel layer 11, e.g., a layer of GaN, atop the substrate, and a III-N barrier layer 12, e.g., a layer of $Al_xGa_{1-x}N$, atop the III-N channel layer. FIGS. 12-13 will be described as though diode 60 is a III-N device; however, other semiconductor materials may be used.

A two-dimensional electron gas (2DEG) channel 19, i.e., a conductive channel, is induced in the III-N channel layer 11 near the interface between the III-N channel layer 11 and the III-N barrier layer 12. Cathode 55 is a single electrode which forms an ohmic contact to the 2DEG channel 19. Anode 54 forms a Schottky or rectifying contact with the semiconductor material which is in direct contact with the anode 54. Substrate 10 may include or be formed of, for example, silicon, sapphire, GaN, AN, SiC, or any other substrate suitable for use in III-N devices. In some implementations, a substrate is not included. For example, in some implementations the substrate is removed prior to completion of device fabrication.

When diode 60 is forward biased, i.e., when the voltage at the anode 54 is greater than that at the cathode 55, the anode Schottky or rectifying contact is forward biased, and electrons flow from the cathode 55, through the 2DEG 19, and into the anode 54. When diode 60 is reverse biased, i.e., when the voltage at the anode 54 is less than that at the cathode 55, only a small reverse bias current flows between the anode 54 and cathode 55, and so the diode blocks the voltage (i.e., the voltage difference) between the anode and cathode.

Diode 60 also includes a field plate 58. In the implementation shown in FIG. 12, the field plate 58 is connected to the anode 54 and extends from the anode 54 towards the cathode 55 over the top surface of insulating layer 13. Other field plate configurations are possible. The field plate 58 reduces the peak electric field in the diode during reverse bias operation, thereby allowing the diode to block larger reverse biases without breaking down. In order for a field plate to effectively minimize the peak electric field when the diode 60 is reverse biased and blocking a voltage, the field plate is electrically connected to a supply of mobile charge, which can be accomplished by electrically connecting the field plate to the anode, as shown in FIG. 12, or in some cases by electrically connecting the field plate to a DC voltage supply or a DC or AC ground.

A guard ring 33 is included between the anode 54 and cathode 55. Guard ring 33 is formed of a conducting material, e.g., nickel, titanium, platinum, gold, aluminum, poly-silicon, or another metal or other conducting material, or a combination of various conducting materials. Guard ring 33 may be formed of the same conducting material as the anode 54. Guard ring 33 is a floating electrode—it is not electrically connected to (i.e., it is electrically isolated from) both the anode 54 and the cathode 55. In general, guard ring 33 is not electrically connected to any DC or AC voltage source, or to a DC or AC ground.

In some implementations, guard ring 33 is positioned in diode 60 so that at least a portion of an insulating layer 13 is between at least a portion of the guard ring 33 and the semiconductor material layer 12. A portion of the insulating layer 13 is also between at least a portion of the guard ring 33 and the conducting 2DEG channel 19. The portion of insulating layer 13 between guard ring 33 and semiconductor material layer 12 (or between guard ring 33 and conducting 2DEG channel 19) is useful, for example, in that it can allow for the guard ring 33 to include a field mitigating portion, as described below, which can prevent material near the guard ring 33 from breaking down during high voltage operation of the diode 60.

In some implementations, guard ring 33 is placed between anode 54 and cathode 55 at a specific location so that the depletion region in the channel during reverse bias operation extends from the anode 54 to the guard ring 33 at or slightly below the breakdown voltage of a similar diode which lacks a guard ring 33. For example, the distance from anode 54 where the depletion region extends when a diode which lacks a guard ring breaks down may be determined using analytical methods or testing. Diode 60 is then formed by placing a guard ring 33 at or before (e.g., slightly before) that distance from anode 54.

The guard ring 33 shown in FIG. 12 includes a main portion which directly contacts or is adjacent to semiconductor material layer 12 and to the 2DEG channel 19. The main portion of the guard ring is placed close enough to the 2DEG channel 19 such that charge induced on the main portion during reverse biasing of diode 60 can alter the electric field distribution in the underlying semiconductor materials, such as to reduce a peak electric field in the device. The guard ring 33 also includes a field mitigating portion 38 which extends from the main portion of the guard ring towards the cathode 55, the field mitigating portion 38 serving to further reduce the peak electric field during reverse bias operation. In the implementation shown in FIG. 12, the field mitigating portion 38 includes a slanted portion. The guard ring 33 can have the same structure as any of the guard rings described previously for transistors, such as any of the guard ring structures shown in FIGS. 5-8. For example, at least a portion of the guard ring can directly contact the underlying semiconductor material, as in FIGS. 6-8.

Figure 14:
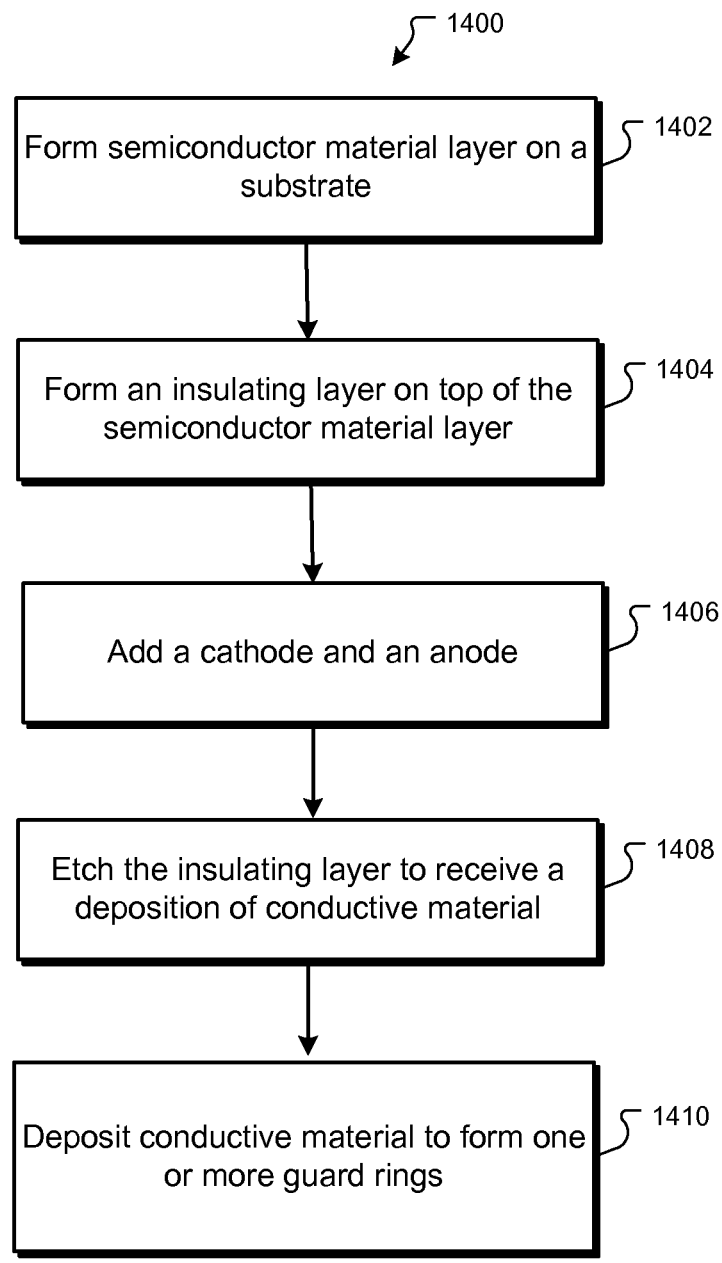
FIG. 14 is a flow diagram of a process for manufacturing a diode including a guard ring.

FIG. 14 is a flow diagram of a process 1400 for manufacturing a diode including a guard ring 33. The process 1400 may be performed, for example, to create the example diode of FIGS. 12-13.

A semiconductor material layer including a conductive channel is formed on a substrate (step 1402). For example, a series of III-N layers including a channel layer and a barrier layer may be formed on the substrate, resulting in the formation of a 2DEG in the channel layer. The III-N layers may be grown epitaxially, e.g., by MOCVD, MBE, HVPE, or another method.

An insulating layer is formed on top of the semiconductor material layer (step 1404). For example, the insulating layer may be grown or deposited by MOCVD, PECVD, high temperature CVD (HTCVD), sputtering, evaporation, or another method. In some embodiments, the insulating layer is formed by a similar or the same method as the semiconductor material layer, and can be formed in the same step. For example, the semiconductor material layer and the insulating layer can all be deposited or grown by MOCVD.

An anode and a cathode are added to the transistor (step 1406). The anode and the cathode contact the conductive channel in the semiconductor material layer. For example, the insulating layer may be removed in regions to receive the anode and cathode, and then the anode and cathode may be formed by evaporation, sputtering, PECVD, HTCVD, or another method. In some implementations, the cathode is formed prior to the formation of the insulating layer. In other implementations, the insulating layer includes a first portion and a second portion, the first portion being formed prior to formation of the cathode, and the second portion being formed after formation of the cathode.

The insulating layer is etched to receive a deposition of conductive material (step 1408). The insulating layer is etched to define regions to receive a one or more guard rings. The guard rings are between the anode and the cathode. In some implementations, the guard ring is a distance from the anode where a depletion region in the semiconductor material layer would extend prior to or at breakdown of the diode. In some implementations, the insulating layer is etched to define a region to receive a field plate.

Conductive material is deposited over the insulating layer to form one or more guard rings (step 1410). The guard rings may be, for example, any of the guard rings 33 illustrated in FIGS. 4-8 and 12-13. Each guard ring is electrically isolated from the anode and the cathode. At least a portion of the insulating layer can be between at least a portion of each guard ring and the semiconductor material layer. In some implementations, conductive material is deposited over the insulating layer to form a field plate.

A number of implementations have been described. Nevertheless, it will be understood that various modifications may be made without departing from the spirit and scope of the techniques and devices described herein. Accordingly, other implementations are within the scope of the following claims.

What is claimed is:

1. A semiconductor transistor, comprising:
a semiconductor material layer;
a conductive channel in the semiconductor material layer;
a source electrode and a drain electrode contacting the conductive channel;
a gate between the source electrode and the drain electrode;
an insulating layer on a surface of the semiconductor material layer; and
a guard ring above the semiconductor material layer and between the gate and the drain electrode, the guard ring comprising an electrically conductive material which is electrically isolated from the source electrode, the drain electrode, and the gate; wherein
a portion of the insulating layer is between at least a portion of the guard ring and the semiconductor material layer, and the guard ring comprises a field mitigating portion.

2. The semiconductor transistor of claim 1, wherein the field mitigating portion comprises electrically conductive material extending from the guard ring towards the drain electrode.

3. The semiconductor transistor of claim 1, wherein the guard ring comprises a first portion extending from a top of the insulating layer towards a bottom of the insulating layer, and wherein the field mitigation portion is substantially perpendicular to the first portion and extends from the first portion towards the drain electrode.

4. The semiconductor transistor of claim 1, wherein the field mitigating portion is formed on top of first and second separating portions of the insulating layer, and wherein the first separating portion is narrower than the second separating portion.

5. The semiconductor transistor of claim 1, wherein the field mitigating portion is slanted, being formed around a via in the insulating layer that is narrower towards the bottom of the insulating layer and wider towards the top of the insulating layer.

6. The semiconductor transistor of claim 1, wherein the guard ring is not electrically connected to any DC and AC voltage sources.

7. The semiconductor transistor of claim 1, wherein the guard ring extends from a top of the insulating layer towards a bottom of the insulating layer without contacting the semiconductor material layer.

8. The guard ring of claim 7, wherein a minimum separation between the guard ring and the semiconductor material layer is at least 20 nanometers.

9. The semiconductor transistor of claim 1, wherein the guard ring is at a distance from the gate where a depletion region in the semiconductor material layer extends prior to or at breakdown of the transistor in a similar transistor which lacks the guard ring.

10. The semiconductor transistor of claim 1, further comprising a field plate.

11. The semiconductor transistor of claim 10, wherein the field plate is electrically connected to the gate.

12. The semiconductor transistor of claim 10, wherein the field plate comprises electrically conducting material contacting the gate and extending from the gate towards the drain electrode.

13. The semiconductor transistor of claim 10, wherein the field plate is slanted, being formed around a via in the insulating layer that is narrower towards a bottom of the insulating layer and wider towards a top of the insulating layer.

14. The semiconductor transistor of claim 1, wherein the transistor is a III-N device.

15. The semiconductor transistor of claim 1, wherein the semiconductor material layer comprises a III-N channel layer and a III-N barrier layer above the III-N channel layer.

16. The semiconductor transistor of claim 15, wherein the conductive channel is a two-dimensional electron gas (2DEG) channel induced in the III-N channel layer near the interface between the III-N channel layer and the III-N barrier layer.

17. The semiconductor transistor of claim 15, wherein the III-N channel layer comprises a layer of GaN.

18. The semiconductor transistor of claim 15, wherein the III-N barrier layer comprises a layer of $Al_xGa_{1-x}N$.

19. The semiconductor transistor of claim 1, wherein the transistor is a high-voltage device.

20. A semiconductor transistor, comprising:
a semiconductor material layer;
a conductive channel in the semiconductor material layer;
a source electrode and a drain electrode contacting the conductive channel;
a gate between the source electrode and the drain electrode;
an insulating layer on a surface of the semiconductor material layer; and
a guard ring above the semiconductor material layer and between the gate and the drain electrode, the guard ring comprising an electrically conductive material which is electrically isolated from the source electrode, the drain electrode, and the gate; wherein the guard ring extends from a top of the insulating layer towards a bottom of the insulating layer and contacts the semiconductor material layer.

21. The semiconductor transistor of claim 20, wherein the transistor is a III-N device.

22. The semiconductor transistor of claim 20, wherein the semiconductor material layer comprises a III-N channel layer and a III-N barrier layer above the III-N channel layer.

23. The semiconductor transistor of claim 22, wherein the conductive channel is a two-dimensional electron gas (2DEG) channel induced in the III-N channel layer near the interface between the III-N channel layer and the III-N barrier layer.

24. The semiconductor transistor of claim 22, wherein the III-N channel layer comprises a layer of GaN.

25. The semiconductor transistor of claim 22, wherein the III-N barrier layer comprises a layer of $Al_xGa_{1-x}N$.

26. A method of manufacturing a semiconductor transistor, the method comprising:
forming a semiconductor material layer on a substrate;
forming an insulating layer on a surface of the semiconductor material layer;
adding source and drain electrodes contacting a conductive channel in the semiconductor material layer;
etching the insulating layer to receive a deposition of conductive material; and
depositing conductive material to form a gate between the source electrode and the drain electrode and a guard ring between the gate and the drain electrode, wherein the guard ring comprises a field mitigating portion and is electrically isolated from the source electrode, the drain electrode, and the gate, and wherein a portion of the insulating layer is between at least a portion of the guard ring and the semiconductor material layer.

27. The method of claim 26, wherein etching the insulating layer comprises etching the insulating layer so that the guard ring is at a distance from the gate where a depletion region in the semiconductor material layer extends prior to or at breakdown of the transistor in a similar transistor which lacks the guard ring.

28. The method of claim 26, wherein etching the insulating layer comprises etching the insulating layer to define a guard ring including a field mitigating portion extending from the guard ring towards the drain electrode.

29. The method of claim 28, wherein the field mitigating portion comprises a plurality of perpendicular field mitigating portions between the top of the insulating layer and the bottom of the insulating layer, each perpendicular field mitigating portion extending perpendicularly from the main portion towards the drain electrode.

30. The method of claim 28, wherein the field mitigating portion is slanted, being formed around a via in the insulating layer that is narrower towards the bottom of the insulating layer and wider towards the top of the insulating layer.

31. The method of claim 26, wherein etching the insulating layer comprises etching the insulating layer to define a field plate.

32. The method of claim 31, further comprising depositing conductive material so that the field plate is electrically connected to the gate.

33. The method of claim 26, wherein forming the semiconductor material layer comprises forming a III-N channel layer and a III-N barrier layer above the III-N channel layer.

34. A method of manufacturing a semiconductor transistor, the method comprising:
forming a semiconductor material layer on a substrate;
forming an insulating layer on a surface of the semiconductor material layer;
adding source and drain electrodes contacting a conductive channel in the semiconductor material layer;
etching the insulating layer to receive a deposition of conductive material; and
depositing conductive material to form a gate between the source electrode and the drain electrode and a guard ring between the gate and the drain electrode, wherein the guard ring is electrically isolated from the source electrode, the drain electrode, and the gate, and wherein the guard ring extends from a top of the insulating layer towards a bottom of the insulating layer and contacts the semiconductor material layer.

35. The method of claim 34, wherein etching the insulating layer comprises etching the insulating layer so that the guard ring is at a distance from the gate where a depletion region in the semiconductor material layer extends prior to or at breakdown of the transistor in a similar transistor which lacks the guard ring.

36. The method of claim 34, wherein etching the insulating layer comprises etching the insulating layer to define a guard ring including a field mitigating portion extending from the guard ring towards the drain electrode.

37. The method of claim 36, wherein the field mitigating portion comprises a plurality of perpendicular field mitigating portions between the top of the insulating layer and the bottom of the insulating layer, each perpendicular field mitigating portion extending perpendicularly from the main portion towards the drain electrode.

38. The method of claim 36, wherein the field mitigating portion is slanted, being formed around a via in the insulating layer that is narrower towards the bottom of the insulating layer and wider towards the top of the insulating layer.

39. The method of claim 34, wherein etching the insulating layer comprises etching the insulating layer to define a field plate.

40. The method of claim 39, further comprising depositing conductive material so that the field plate is electrically connected to the gate.

41. The method of claim 34, wherein forming the semiconductor material layer comprises forming a III-N channel layer and a III-N barrier layer above the III-N channel layer.

* * * * *

UNITED STATES PATENT AND TRADEMARK OFFICE
CERTIFICATE OF CORRECTION

| | |
|---|---|
| PATENT NO. | : 8,901,604 B2 |
| APPLICATION NO. | : 13/226380 |
| DATED | : December 2, 2014 |
| INVENTOR(S) | : Mishra et al. |

It is certified that error appears in the above-identified patent and that said Letters Patent is hereby corrected as shown below:

In the Claims

Column 15, line 22, claim 20 delete "laver;" and insert --layer;--.

Signed and Sealed this
Second Day of June, 2015

Michelle K. Lee
*Director of the United States Patent and Trademark Office*